(12) United States Patent
Kim et al.

(10) Patent No.: US 9,228,763 B2
(45) Date of Patent: Jan. 5, 2016

(54) THERMOELECTRIC COOLING PACKAGES AND THERMAL MANAGEMENT METHODS THEREOF

(71) Applicants: Jae Choon Kim, Incheon (KR); Jichul Kim, Yongin-si (KR); Jin-Kwon Bae, Hwaseong-si (KR); Eunseok Cho, Suwon-si (KR)

(72) Inventors: Jae Choon Kim, Incheon (KR); Jichul Kim, Yongin-si (KR); Jin-Kwon Bae, Hwaseong-si (KR); Eunseok Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 323 days.

(21) Appl. No.: 13/692,394

(22) Filed: Dec. 3, 2012

(65) Prior Publication Data

US 2013/0139524 A1    Jun. 6, 2013

(30) Foreign Application Priority Data

Dec. 1, 2011    (KR) .................. 10-2011-0127818

(51) Int. Cl.
*H01L 35/32*    (2006.01)
*F25B 21/02*    (2006.01)

(52) U.S. Cl.
CPC .............. *F25B 21/02* (2013.01); *H01L 35/32* (2013.01); *F25B 2321/0212* (2013.01); *F25B 2700/2107* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01)

(58) Field of Classification Search
CPC ................................. H01L 35/32; F25B 21/02
USPC ........................................... 62/3.2, 259.2, 3.7
See application file for complete search history.

(56) References Cited

U.S. PATENT DOCUMENTS

| | | | |
|---|---|---|---|
| 5,032,897 A | 7/1991 | Mansuria et al. | |
| 5,569,950 A * | 10/1996 | Lewis et al. | 257/467 |
| 6,345,507 B1 * | 2/2002 | Gillen | 62/3.7 |
| 6,957,352 B2 | 10/2005 | Greiner et al. | |
| 7,165,183 B2 | 1/2007 | Okada et al. | |
| 7,301,233 B2 | 11/2007 | Lee et al. | |
| 7,586,125 B2 | 9/2009 | Dai et al. | |
| 7,851,905 B2 | 12/2010 | Chrysler et al. | |
| 7,915,081 B2 | 3/2011 | Tomita et al. | |
| 8,649,179 B2 * | 2/2014 | Hershberger et al. | 361/712 |
| 2008/0264464 A1 * | 10/2008 | Lee et al. | 136/201 |
| 2010/0163090 A1 * | 7/2010 | Liu et al. | 136/224 |
| 2011/0032679 A1 | 2/2011 | Baek et al. | |
| 2011/0042805 A1 | 2/2011 | Yu et al. | |

FOREIGN PATENT DOCUMENTS

| | | |
|---|---|---|
| JP | 4-216656 A | 8/1992 |
| JP | 11-102931 A | 4/1999 |

(Continued)

*Primary Examiner* — Cassey D Bauer
(74) *Attorney, Agent, or Firm* — Sughrue Mion, PLLC

(57) ABSTRACT

Provided are thermoelectric cooling packages and thermal management methods thereof. The method may include measuring a temperature of the thermoelectric cooling package including a semiconductor chip and a thermoelectric cooler, comparing the temperature of the thermoelectric cooling package with a target temperature, operating the thermoelectric cooler when the temperature of the thermoelectric cooling package is higher than the target temperature, and stopping the operation of the thermoelectric cooler when the temperature of the thermoelectric cooling package becomes lower than the target temperature.

13 Claims, 27 Drawing Sheets

(56) References Cited

FOREIGN PATENT DOCUMENTS

| JP | 2003-188062 A | 7/2003 |
| KR | 10-0629679 B1 | 9/2006 |
| KR | 10-0716865 B1 | 5/2007 |
| KR | 10-2010-0000439 A | 1/2010 |
| KR | 10-2011-0015160 A | 2/2011 |
| KR | 10-1026618 B1 | 4/2011 |

\* cited by examiner

THERMOELECTRIC COOLING PACKAGES AND THERMAL MANAGEMENT METHODS THEREOF

CROSS-REFERENCE TO RELATED APPLICATIONS

This U.S. non-provisional patent application claims priority under 35 U.S.C. §119 to Korean Patent Application No. 10-2011-0127818, filed on Dec. 1, 2011, the entirety of which is incorporated by reference herein.

BACKGROUND

The inventive concept relates to semiconductor and, more particularly, to thermoelectric cooling packages including a thermoelectric cooler and thermal management methods thereof.

Electronic devices have been increasingly smaller and lighter with development of the semiconductor industry and through the requirement of users, and semiconductor packages used as components of the electronic devices have also been increasingly smaller and lighter. To satisfy the above demands, a plurality of semiconductor chips or semiconductor chips of various kinds which are stacked to realize a single package have been developed. However, heat radiated from the semiconductor package including the stacked semiconductor chips during operation thereof may increase to cause thermal stress.

SUMMARY

Exemplary embodiments of the inventive concept may provide thermoelectric cooling packages capable of efficiently radiating heat and thermal management methods thereof.

Exemplary embodiments of the inventive concept may also provide thermoelectric cooling packages capable of radiating heat without degradation of performance and thermal management methods thereof.

Exemplary embodiments of the inventive concept may also provide thermoelectric cooling packages capable of resolving thermal problems in the use of user and thermal management methods thereof.

In one aspect, the thermoelectric cooling package and the thermal management method according to exemplary embodiments of the inventive concept may use a thermoelectric cooler (TEC). In another aspect, embodiments of the inventive concept may realize an operation of a semiconductor package without degradation of performance according to cooling. In still aspect, exemplary embodiments of the inventive concept may selectively change a direction of a heat flow to actively deal with heat generating problems according to a change of a structure.

According to some exemplary embodiments of the inventive concepts, a thermal management method of a thermoelectric cooling package may include: measuring a temperature of the thermoelectric cooling package including a semiconductor chip and a thermoelectric cooler; comparing the temperature of the thermoelectric cooling package with a target temperature; operating the thermoelectric cooler when the temperature of the thermoelectric cooling package is higher than the target temperature.

In some exemplary embodiments, the method may further comprise stopping the operation of the thermoelectric cooler when the temperature of the thermoelectric cooling package becomes lower than the target temperature.

In some exemplary embodiments, measuring the temperature of the thermoelectric cooling package may include measuring the temperature of the thermoelectric cooling package by a temperature sensor included in the thermoelectric cooling package.

In other exemplary embodiments, the method may further include: reducing a clock frequency of the semiconductor chip when the temperature of the thermoelectric cooling package is higher than the target temperature; and increasing the clock frequency when the temperature of the thermoelectric cooling package becomes lower than the target temperature by reducing the clock frequency.

In still other exemplary embodiments, the thermoelectric cooler may be operated without the reduction of the clock frequency after the clock frequency is increased.

In yet other exemplary embodiments, reducing the clock frequency and operating the thermoelectric cooler may be performed simultaneously.

In some exemplary embodiments, the thermoelectric package may include a temperature sensor and the temperature sensor may sense the temperature of the thermoelectric package.

In other exemplary embodiments, a temperature of the semiconductor chip may be changed at a temperature equal to or lower than the target temperature without a change of an operation clock speed of the semiconductor chip.

In still other exemplary embodiments, the method may further include: changing a clock speed of the semiconductor chip simultaneously with operating the thermoelectric cooler, wherein the changing the clock speed comprises changing the clock speed into maximum level, minimum level, or at least one medium level between the maximum and minimum levels depending on the temperature of the thermoelectric package. In yet other exemplary embodiments, operating the thermoelectric cooler may include: providing voltage to the thermoelectric cooler, wherein a value of the voltage varies according to the clock speed.

In yet still other exemplary embodiments, operating the thermoelectric cooler may include: discharging the heat generated from the thermoelectric cooler through the thermoelectric cooler. The heat sink may be connected to the thermoelectric cooler and the semiconductor chip.

According to still other exemplary embodiments of the inventive concepts, a thermal management method of a thermoelectric cooling package may include: providing the thermoelectric cooling package comprising a semiconductor package and a thermoelectric cooler, the semiconductor package including a temperature sensor and the thermoelectric cooler having a heat flowing path between the semiconductor package; measuring a temperature of the semiconductor package by the temperature sensor to compare the measured temperature with a target temperature; when the temperature of the semiconductor package is higher than the target temperature, applying a voltage to the thermoelectric cooler to absorb and discharge heat generated from the semiconductor package, thereby lowering the temperature of the semiconductor package; and when the temperature of the semiconductor package is lower than the target temperature, shutting off the voltage applied to the thermoelectric cooler to stop an operation of the thermoelectric cooler. The thermoelectric cooler may be transiently operated when the temperature of the semiconductor package is higher than the target temperature.

In some exemplary embodiments, lowering the temperature of the semiconductor package may include: maintaining the temperature of the semiconductor package under the target temperature, the temperature of the semiconductor package changing up and down.

In other exemplary embodiments, the method may further include: changing an operation clock speed of the semiconductor package to lower the temperature of the semiconductor package.

In still other exemplary embodiments, changing the operation clock speed may be performed before or after applying the voltage to the thermoelectric cooler.

In yet other exemplary embodiments, changing the operation clock speed and applying the voltage to the thermoelectric cooler may be performed simultaneously.

According to further still other exemplary embodiments of the inventive concepts, a thermal management method of a thermoelectric cooling package comprising a semiconductor chip and a thermoelectric cooler may comprise operating the thermoelectric cooler by providing a voltage so as to decrease a temperature of the semiconductor chip. The thermoelectric cooler may be transiently operated according to the temperature of the semiconductor chip.

In some exemplary embodiments, the method may further comprise changing a clock frequency of the semiconductor chip. The changing the clock frequency may comprise: decreasing the clock frequency of the semiconductor chip concurrently with transiently providing the voltage to the thermoelectric cooler; and increasing the clock frequency of the semiconductor chip concurrently with removing the voltage provided to the thermoelectric cooler.

In other exemplary embodiments, the decreasing the temperature of the semiconductor chip may comprise transiently providing a voltage to the thermoelectric cooler and simultaneously decreasing a clock frequency of the semiconductor chip.

In still other exemplary embodiments, a providing time of the voltage may be longer than a duration time of decreasing the clock frequency.

In further still other exemplary embodiments, the method may further comprise increasing the clock frequency of the semiconductor chip and simultaneously removing the voltage provided to the thermoelectric cooler when the temperature of the semiconductor chip is lowered.

In further still other exemplary embodiments, the decreasing the temperature of the semiconductor chip may comprise changing a clock frequency of the semiconductor chip into maximum level, minimum level, or at least one medium level between the maximum and minimum levels, wherein a voltage is transiently provided to the thermoelectric cooler when the clock frequency of the semiconductor chip is changed into any value smaller than the maximum value.

In yet other exemplary embodiments, the decreasing the temperature of the semiconductor chip may comprise transiently providing a voltage to the thermoelectric cooler when the clock frequency of the semiconductor chip is changed into the minimum value; and removing the voltage provided to the thermoelectric cooler when the clock frequency of the semiconductor chip is changed into at least one of the medium value and the maximum value.

In yet still other exemplary embodiments, the decreasing the temperature of the semiconductor chip may comprise transiently providing a voltage to the thermoelectric cooler when the clock frequency of the semiconductor chip is changed into at least one of the medium value and the minimum value; and removing the voltage provided to the thermoelectric cooler when the clock frequency of the semiconductor chip is changed into the maximum value.

In yet still other exemplary embodiments, the decreasing the temperature of the semiconductor chip may comprises: transiently providing a first voltage to the thermoelectric cooler when the clock frequency is changed into the medium value; transiently providing a second voltage greater than the first voltage to the thermoelectric cooler when the clock frequency is changed into the minimum value; and providing no voltage to the thermoelectric cooler or removing the first or second voltage when the clock frequency is changed into the maximum value.

In yet further still other exemplary embodiments, the decreasing the temperature of the semiconductor chip may comprise transiently providing a voltage to the thermoelectric cooler when the temperature of the semiconductor chip is high, and removing the voltage provided to the thermoelectric cooler or no voltage is provided to the thermoelectric cooler when the temperature of the semiconductor chip is low.

In yet further still other exemplary embodiments, a clock frequency may be changed into maximum level, minimum level, or at least one medium level between the maximum and minimum levels. The decreasing the temperature of the semiconductor chip may comprise: transiently providing a first voltage to the thermoelectric cooler when the clock frequency is changed into the medium value; transiently providing a second voltage greater than the first voltage to the thermoelectric cooler when the clock frequency is changed into the maximum value; and providing no voltage to the thermoelectric cooler or removing the first or second voltage when the clock frequency is changed into the minimum value.

According to yet other exemplary embodiments of the inventive concepts, a thermoelectric cooling package may include: a substrate on which a thermoelectric cooler is disposed, the substrate including a mounting portion; and a semiconductor device mounted on the mounting portion of the substrate to be combined with the thermoelectric cooler. The thermoelectric cooler may absorb heat from the semiconductor device to discharge the heat to the outside by applying a voltage thereto. The thermoelectric cooler may be transiently operated when a temperature of the semiconductor device is higher than a target temperature.

In some exemplary embodiments, the semiconductor device may comprise a temperature sensor.

In some exemplary embodiments, the package may further include: a heat sink in contact with the thermoelectric cooler and the semiconductor device.

In other exemplary embodiments, the thermoelectric cooler may be adjacent to at least one sidewall of the semiconductor device and the thermoelectric cooler may share the substrate with the semiconductor device.

In still other exemplary embodiments, the thermoelectric cooler may include a plurality of cooling components operated simultaneously or individually.

In yet other exemplary embodiments, the semiconductor device may include a semiconductor package. The semiconductor package may comprises: a first package including the substrate and at least one first semiconductor chip mounted on the mounting portion; and a second package including a second substrate on which at least one second semiconductor chip is mounted, the second package being stacked on the first package.

In yet still other exemplary embodiments, the thermoelectric cooler may include: a first thermoelectric cooler disposed on the substrate of the first package; and a second thermoelectric cooler disposed on the second substrate of the second package.

In further exemplary embodiments, the substrate may be divided into at least two portions comprising a first portion on which the semiconductor device is mounted and a second portion on which the thermoelectric cooler is mounted.

In still further exemplary embodiments, the substrate may include at least one metal via connected to the thermoelectric cooler.

In even further exemplary embodiments, the package may further include: an electronic device connected to at least the thermoelectric cooler. The thermoelectric cooler may absorb heat from the electronic device to discharge the heat by applying a voltage thereto.

In even still further exemplary embodiments, the package may further comprise a temperature sensor measuring a temperature of the electronic device.

According to yet still exemplary embodiments of the inventive concepts, a thermoelectric cooling package may include: a semiconductor package; a thermoelectric cooler absorbing heat generated from the semiconductor package to discharge the heat; a board on which the thermoelectric cooler is mounted; and a heat sink in contact with the semiconductor package and the thermoelectric cooler. The thermoelectric cooler may be operated by applying a voltage thereto, such that the thermoelectric cooler absorbs the heat from the semiconductor package to transmit the heat to the heat sink. The thermoelectric cooler may be operated when a temperature of the semiconductor package is higher than a target temperature.

In some exemplary embodiments, the semiconductor package may include at least one semiconductor chip mounted on a package substrate. The board may be the package substrate. The thermoelectric cooler may constitute a portion of the semiconductor package.

In other exemplary embodiments, the board may be divided into at least two portions by separating a portion of the semiconductor package on which the semiconductor package is mounted from a portion of the semiconductor package on which the thermoelectric cooler is mounted, thereby prohibiting a heat flow from the thermoelectric cooler to the semiconductor package.

In still other exemplary embodiments, the operation of the thermoelectric cooler may be stopped when the temperature of the semiconductor package is lower than the target temperature.

In yet other exemplary embodiments, the temperature of the semiconductor package may be changed up and down in a temperature range lower than the target temperature. An operation clock frequency of the semiconductor package may be substantially fixed.

BRIEF DESCRIPTION OF THE DRAWINGS

The inventive concept will become more apparent in view of the attached drawings and accompanying detailed description.

FIGS. 5H to 5O are graphs illustrating variations of a clock frequency and voltage supplied to a thermoelectric cooler of a thermoelectric cooling package according to exemplary embodiments of the inventive concept;

DETAILED DESCRIPTION OF THE EXEMPLARY EMBODIMENTS

Figure 1:
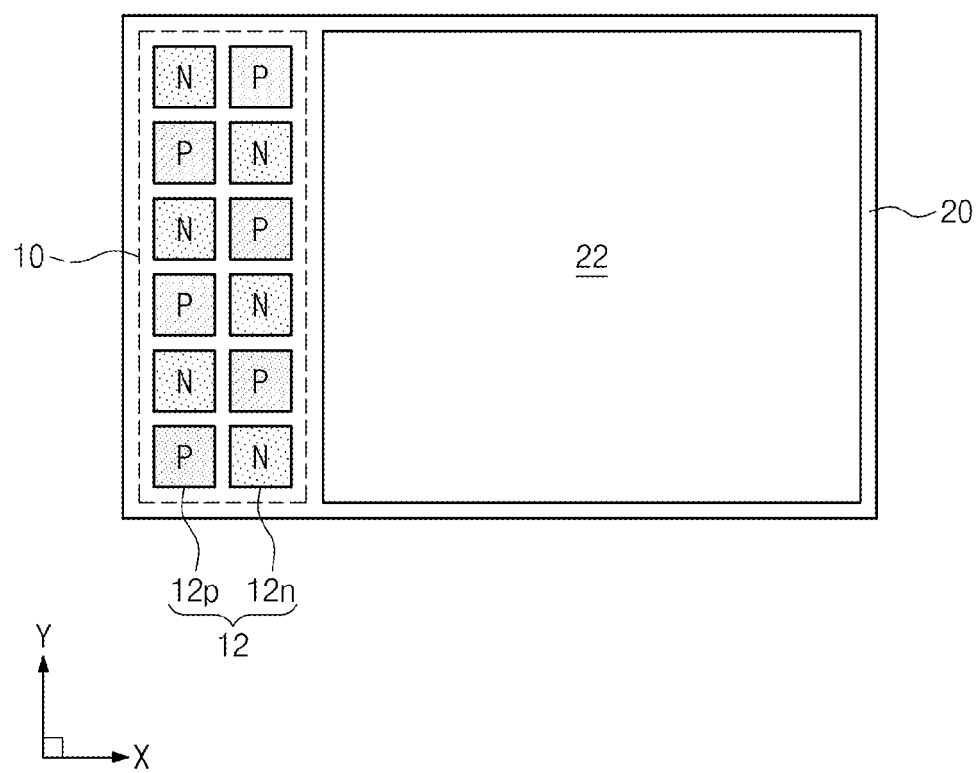
FIG. 1 is a plan view illustrating a thermoelectric cooler according to exemplary embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, exemplary embodiments of the inventive concept are not limited to the specific examples provided herein and are exaggerated for clarity.

The terminology used herein is for the purpose of describing particular exemplary embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the exemplary embodiment in the detailed description will be described with sectional views as ideal exemplary views of the inventive concept. Accordingly, shapes of the exemplary views may be modified according to manufacturing techniques and/or allowable errors. Therefore, the exemplary embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some exemplary embodiments could be termed a second element in other exemplary embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

[Exemplary Embodiment of Thermoelectric Cooler]

FIG. 1 is a plan view illustrating a thermoelectric cooler according to exemplary embodiments of the inventive concept.

Referring to FIG. 1, a thermoelectric cooler (hereinafter, referred to as 'TEC') 10 may be disposed on a substrate 20 on which a semiconductor device is mounted. The substrate 20 may be a printed circuit board, a computer main board, a mobile set board, or a memory module substrate that may provide a mounting portion 22 on which a semiconductor device such as a semiconductor chip or a semiconductor package is mounted. The TEC 10 may include at least one thermoelectric couple 12 which performs a cooling action by the Peltier effect. The at least one thermoelectric couple 12 may be disposed at or toward a side edge of the substrate 20. The thermoelectric couple 12 may include a pair of thermoelectric materials, for example, where one of the pair is made of a metal or a material that is different from the metal or the material used to make the other of the pair, or P-type and N-type semiconductors. The TEC 10 according to the present exemplary embodiment may include a thermoelectric semiconductor which has a more excellent cooling efficiency and faster operation speed than metal. For example, the TEC 10 may include the thermoelectric couple 12 having a P-type semiconductor 12$p$ and an N-type semiconductor 12$n$. The TEC may include a plurality of the thermoelectric couples 12. The thermoelectric semiconductor may include Bi—Te, Pb—Te, Fe—Si, and/or Si—Ge.

[Exemplary Embodiment of Thermoelectric Couple]

Figure 2A:
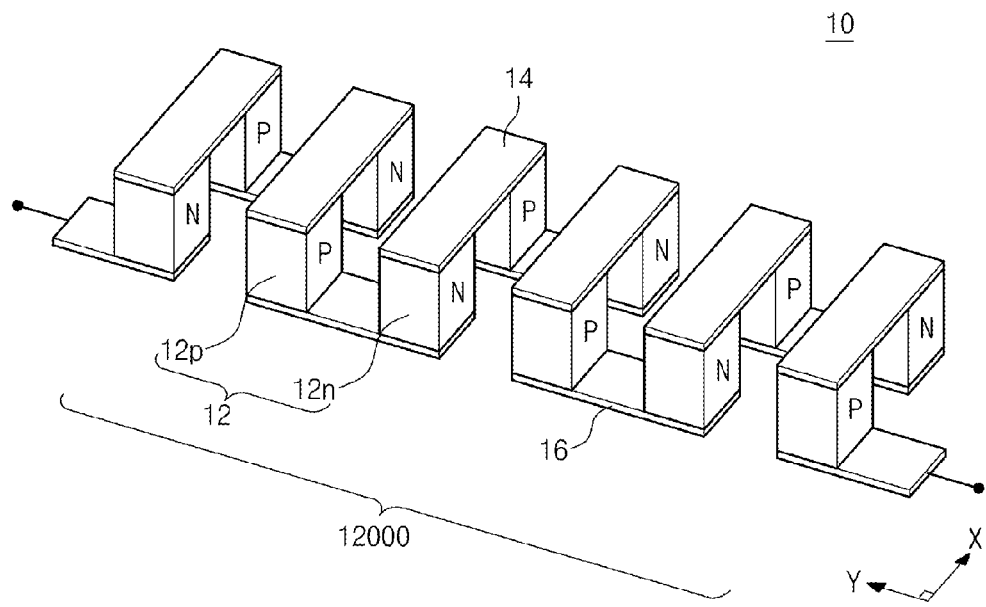
FIG. 2A is a perspective view illustrating a thermoelectric couple of a thermoelectric cooler according to exemplary embodiments of the inventive concept.
Figure 2B:
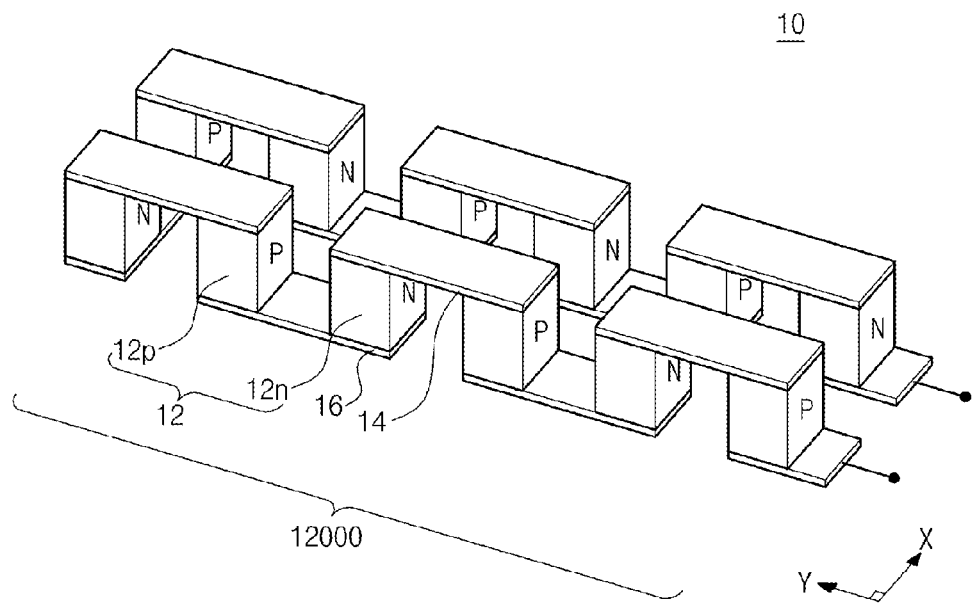
FIG. 2B is a perspective view illustrating a modified exemplary embodiment of FIG. 2A.

FIG. 2A is a perspective view illustrating a thermoelectric couple of a thermoelectric cooler according to exemplary embodiments of the inventive concept. FIG. 2B is a perspective view illustrating a modified exemplary embodiment of FIG. 2A.

Referring to FIG. 2A, the P-type semiconductor 12$p$ and the N-type semiconductor 12$n$ may arranged along an X direction to constitute one thermoelectric couple 12, and plural thermoelectric couples 12000 may constitute plural TECs. The plural thermoelectric couples 12000 are arranged along a Y direction. Since the TEC 10 includes the plural thermoelectric couples 12000, the TEC 10 may have improved heat exchange performance and capacity. The P-type semiconductor and the N-type semiconductor of adjacent thermoelectric couples of the plural thermoelectric couples 12000 in the Y direction may be conversely located. Thus, the P-type semiconductors and N-type semiconductors may be alternatingly arranged in the Y direction. The P-type semiconductor 12$p$ and the N-type semiconductor 12$n$ constituting one thermoelectric couple 12 may be connected to each other through a first metal layer 14. The P-type semiconductor 12$p$ included in the thermoelectric couple 12 may be connected to the N-type semiconductor included in another of the plural thermoelectric couples 12000, adjacent to the thermoelectric couple 12 through a second metal layer 16. A voltage may be applied through the second metal layer connected to the first P-type semiconductor of the first thermoelectric couple of the plural thermoelectric couples 12000 and the second metal layer connected to the last N-type semiconductor of the last thermoelectric couple of the plural thermoelectric couples 12000. A moving direction of the heat passing through the TEC 10 may be varied according to polarity of the applied voltage as described with reference to FIGS. 3A through 3D.

Referring to FIG. 2B, the P-type semiconductor 12$p$ and the N-type semiconductor 12$n$ adjacent to each other in the Y direction may constitute one thermoelectric couple 12, and the plural thermoelectric couples 12000 may be arranged along the Y direction to constitute the TEC 10. The P-type semiconductor and the N-type semiconductors of adjacent thermoelectric couples of the plural thermoelectric couples 12000 in the X direction may be conversely located. Thus, the P-type semiconductors and the N-type semiconductors may be alternatingly arranged along the Y direction. In another exemplary embodiment, X direction may be changed into the Y direction, and vice versa.

Figure 3A:
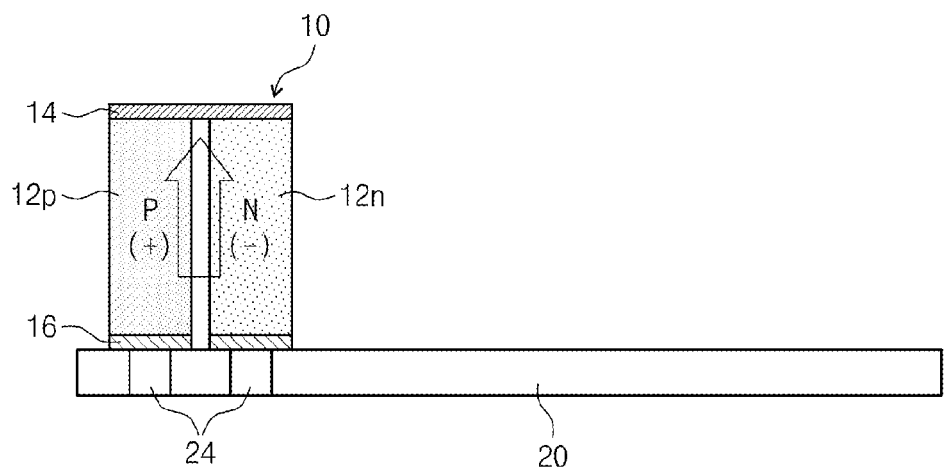
FIGS. 3A through 3D are cross sectional views illustrating cooling actions of thermoelectric coolers according to exemplary embodiments of the inventive concept.
Figure 3B:
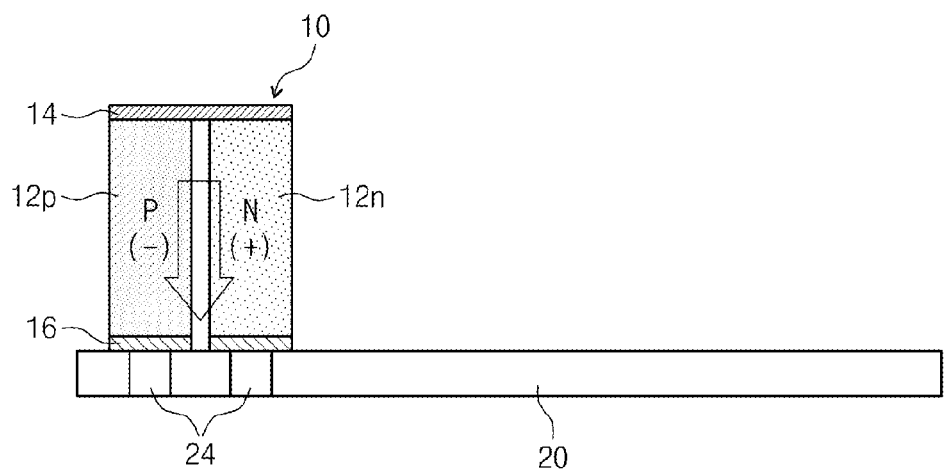
Figure 3C:
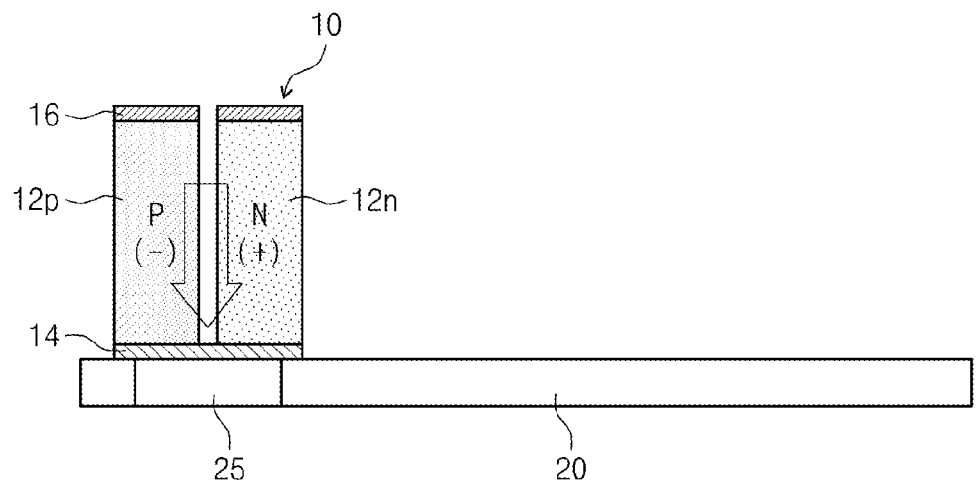
Figure 3D:
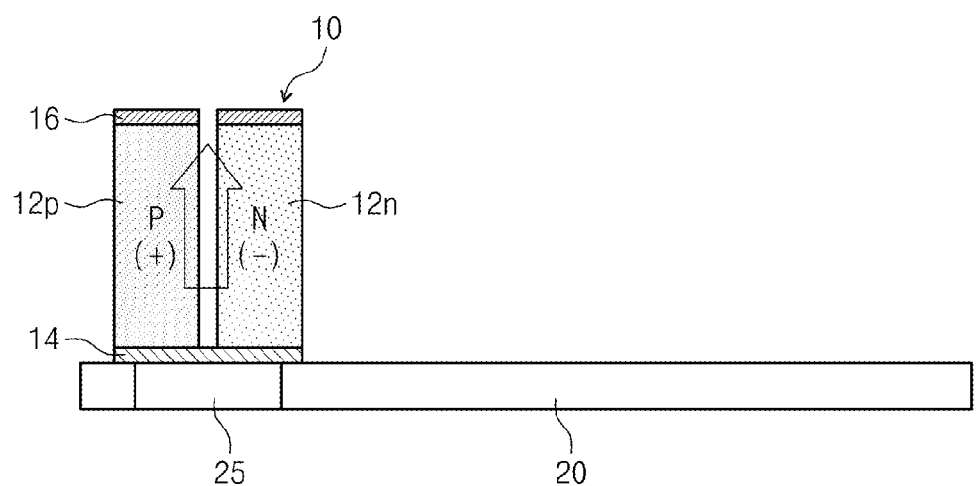

The TEC 10 may be disposed on the substrate 20 in the state that the second metal layers are adjacent to the substrate 20 as illustrated in FIGS. 3A and 3B. Alternatively, the TEC 10 may be disposed on the substrate 20 in a manner so that the first metal layers 14 are adjacent to the substrate 20 as illustrated in FIGS. 3C and 3D. The TEC 10 may have a single layered structure as the present exemplary embodiment. Alternatively, the thermoelectric couples 12 may be stacked with a thermal conductive insulator (e.g. polyimide, silicon-boron nitride, or aluminum oxide ceramic) therebetween, so that the TEC 10 may have a multi-layered structure.

[Operational Exemplary Embodiment of Thermoelectric Cooler]

FIGS. 3A through 3D are cross sectional views illustrating cooling actions in thermoelectric coolers according to exemplary embodiments of the inventive concept. FIGS. 3A through 3D are cross sectional views taken along an X direction of FIG. 1. Arrows illustrated in drawings represent a main flow of heat.

As illustrated in FIGS. 3A and 3B, when the TEC 10 is disposed on the substrate 20 in the manner so that the second metal layers 16 are adjacent to the substrate 20, the heat may be moved upwardly or downwardly along the TEC 10 according to the polarity of the applied voltage. For example, as illustrated in FIG. 3A, if a positive voltage is applied to the P-type semiconductor 12p and a negative voltage is applied to the N-type semiconductor 12n through the second metal layer 16, holes in the P-type semiconductor 12p may move toward a cathode (i.e. toward the first metal layer 14) and electrons in the N-type semiconductor 12n may move toward an anode (i.e. toward the first metal layer 14). The heat may be transferred from a bottom to a top of the TEC 10 by the flow of the electrons and the holes, thereby having heat absorption below the TEC 10 and heat radiation above the TEC 10. Alternatively, as illustrated in FIG. 3B, if a negative voltage is applied to the P-type semiconductor 12p and a positive voltage is applied to the N-type semiconductor 12n through the second metal layer 16, holes in the P-type semiconductor 12p may move toward a cathode (i.e. toward the second metal layer 16 being in contact with the P-type semiconductor 12p) and electrons in the N-type semiconductor 12n may move toward an anode (i.e. toward the second metal layer 16 being in contact with the N-type semiconductor 12n). The heat may be transferred from the top to the bottom of the TEC 10 by the flow of the electrons and the holes, thereby having heat absorption above the TEC 10 and heat radiation below the TEC 10. Metal vias 24 may be further provided to be connected to the second metal layers 16. The metal vias 24 may penetrate the substrate 20. The metal vias 24 may be used as heat transmission paths to improve heat absorption/radiation effects. The metal vias 24 may also used as voltage supply paths.

As illustrated in FIGS. 3C and 3D, the TEC 10 may be disposed on the substrate so that the first metal layers 14 are adjacent to the substrate 20. As illustrated in FIG. 3C, if a negative voltage is applied to the P-type semiconductor 12p and a positive voltage is applied to the N-type semiconductor 12n, the heat may be downwardly transferred along the TEC 10 to generate the heat absorption above the TEC 10 and the heat radiation below the TEC 10. Conversely, as illustrated in FIG. 3D, if a positive voltage is applied to the P-type semiconductor 12p and a negative voltage is applied to the N-type semiconductor 12n, the heat may be upwardly transferred along the TEC 10 to have heat radiation above the TEC 10 and heat absorption below the TEC 10. A heat via 25 may further be provided to be connected to the first metal layer 14 and to penetrate the substrate 20. Thus, the heat absorption/radiation effects may be improved. In some exemplary embodiments, a size of the heat via 25 may be equal to or greater than a size of the first metal layer 14, thereby maximizing heat transmission amount of the heat transmitted down the TEC 10.

[Example of Arrangement of Thermoelectric Cooler]

Figure 4A:
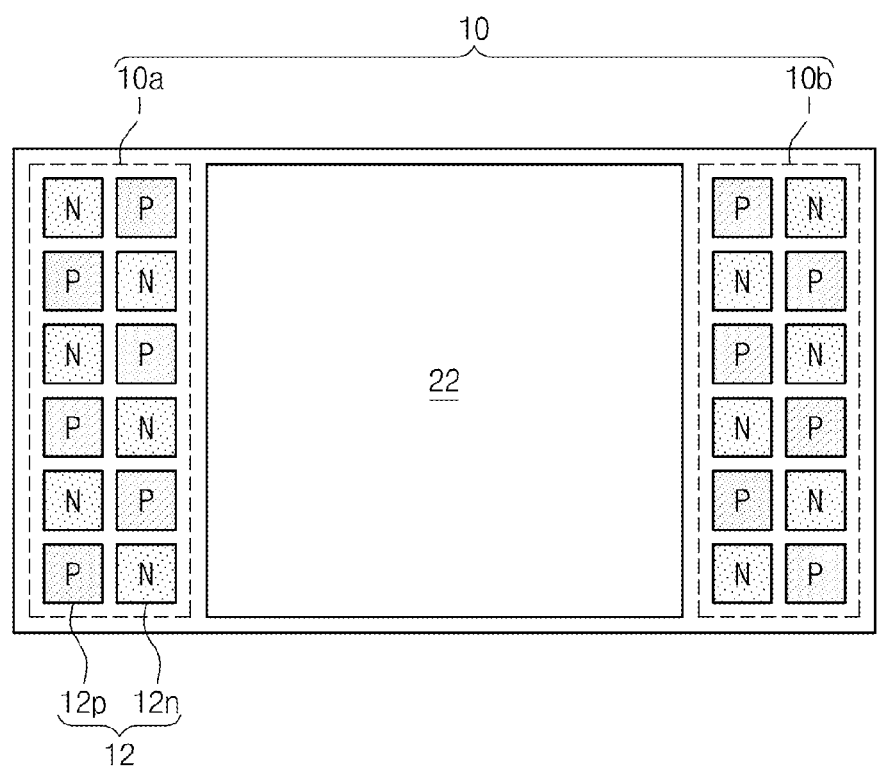
FIGS. 4A through 4C are plan views illustrating examples of arrangement of a thermoelectric cooler according to exemplary embodiments of the inventive concept.
Figure 4B:
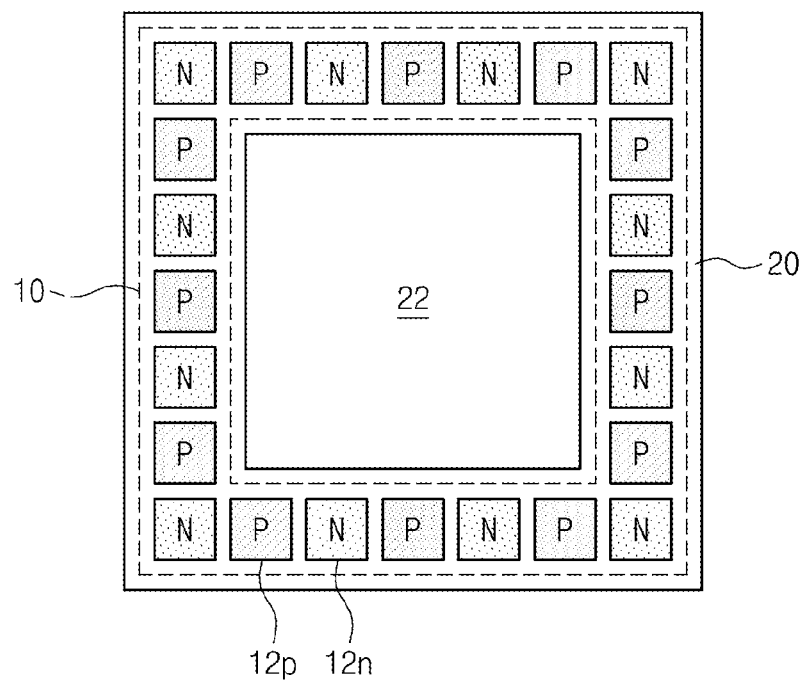
Figure 4C:
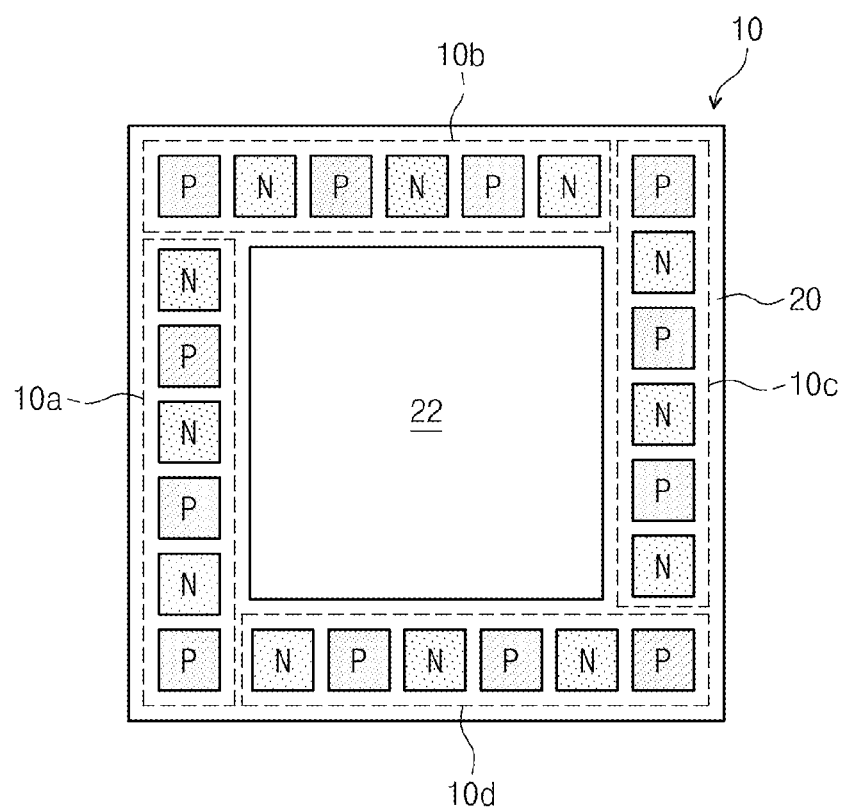

FIGS. 4A through 4C are plan views illustrating examples of arrangement of a thermoelectric cooler according to exemplary embodiments of the inventive concept.

Referring to FIG. 4A, the TEC 10 may be disposed on the substrate 20 at both sides of the mounting portion 22. For example, a first TEC 10a may be disposed on or toward one side edge of the substrate 20 and a second TEC 10b may be disposed on or toward another side edge of the substrate opposite to the one side edge. At least one of the first TEC 10a and the second TEC 10b may be illustrated in FIG. 2A or FIG. 2B. As illustrated in FIG. 3A, the second metal layer 16 of the at least one of the first TEC 10a and the second TEC 10b may be adjacent to the substrate 20. Alternatively, as illustrated in FIG. 3C, the first metal layer 14 of the at least one of the first TEC 10a and the second TEC 10b may be adjacent to the substrate 20. The first TEC 10a may be operated in conjunction with the second TEC 10b. Alternatively, the first TEC 10a may be operated independently of the second TEC 10b. For example, one of the first and second TECs 10a and 10b may be selectively operated.

Referring to FIG. 4B, a number of TECs may extend along or be disposed about an edge of the substrate 20. The TECs may include the P-type semiconductors and the N-type semiconductors which are alternatingly arranged in or along the edge of the substrate 20. The TECs may have a loop shape surrounding the mounting portion 22. The P-type semiconductors and the N-type semiconductors may be arranged along the edge of the substrate 20 to constitute one row or a plurality of rows (e.g. two rows).

Referring to FIG. 4C, the TEC 10 may include a plurality of TECs 10a, 10b, 10c, and 10d which are arranged along the edge of the substrate 20 to surround the mounting portion 22. For example, a first TEC 10a may be disposed on a left side edge of the substrate 20, and second, third and fourth TECs 10b, 10c, and 10d may be disposed on other side edges of the substrate 20 in a clockwise direction. The first to fourth TECs 10a, 10b, 10c, and 10d may be operated simultaneously or individually.

The TEC 10 described with reference to the above drawings may be combined with a semiconductor chip or a semiconductor package mounted on the mounting portion 22 to constitute a thermoelectric cooling package. Alternatively, the TEC 10 may be embedded in a semiconductor chip or a semiconductor package to constitute a thermoelectric cooling package. Various exemplary embodiments of the thermoelectric cooling package will be described hereinafter.

[Exemplary Embodiment of Thermoelectric Cooling Package]

Figure 5A:
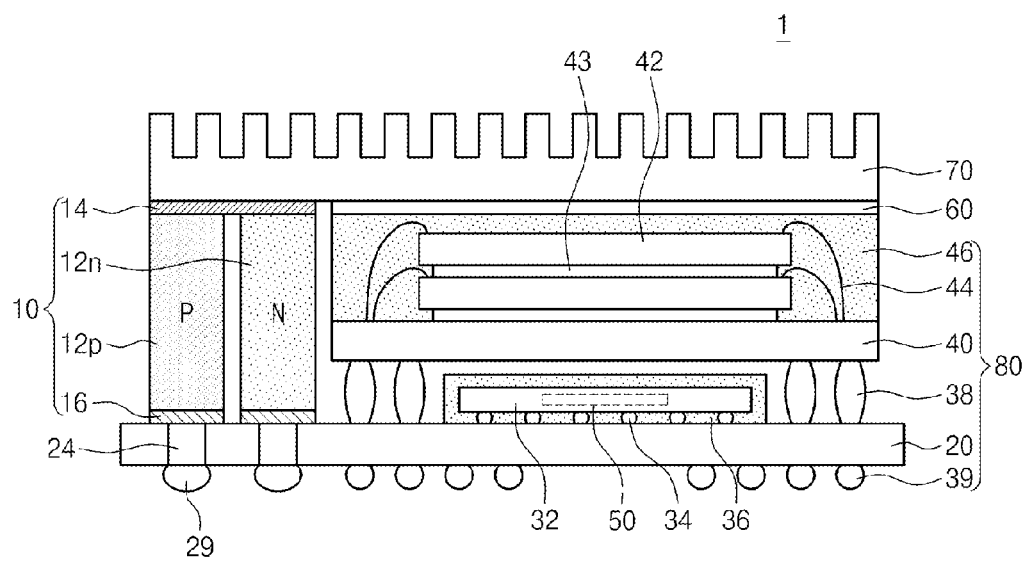
FIG. 5A is a cross sectional view illustrating a thermoelectric cooling package according to exemplary embodiments of the inventive concept.
Figure 5B:
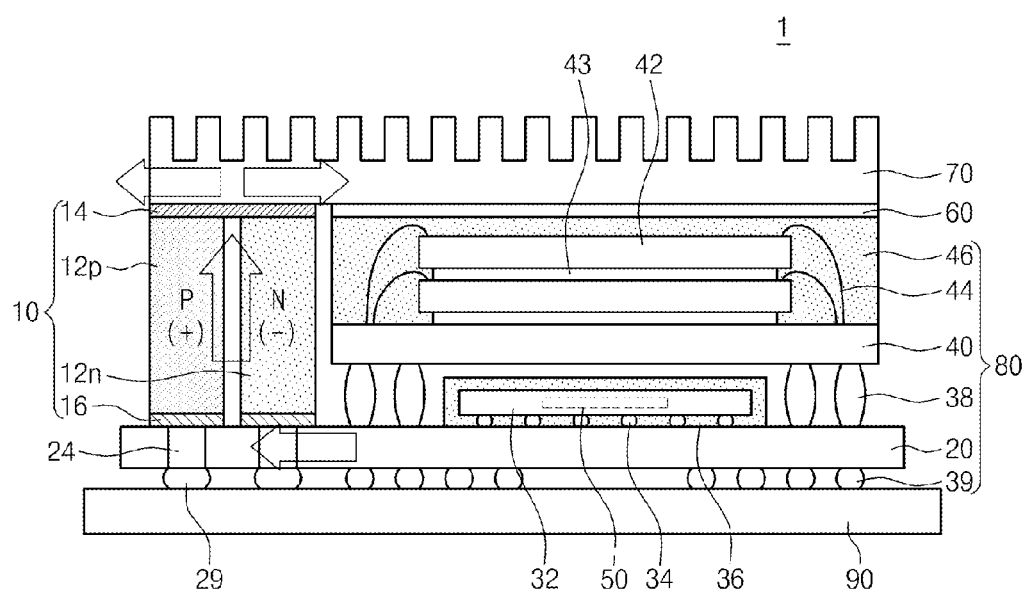
FIG. 5B is a cross sectional view illustrating a cool action of a thermoelectric cooler in a thermoelectric cooling package according to exemplary embodiments of the inventive concept.

FIG. 5A is a cross sectional view illustrating a thermoelectric cooling package according to exemplary embodiments of the inventive concept. FIG. 5B is a cross sectional view illustrating a cool action of a thermoelectric cooler in a thermoelectric cooling package according to exemplary embodiments of the inventive concept.

Referring to FIG. 5A, a thermoelectric cooling package 1 may include the substrate 20 (hereinafter, referred to as 'first package substrate') on which the TEC 10 is disposed, a logic chip 32 mounted on the first package substrate 20, and a plurality of memory chips 42 mounted on a second package substrate 40. Thus, the thermoelectric cooling package 1 may include a structure including a package-on-package 80 (hereinafter, referred to as 'POP') combined with the TEC 10. The thermoelectric cooling package 1 may further include a heat sink 70 to effectively discharge heat.

The logic chip 32 may be mounted on a top surface of the first package substrate 20 in a face down state or a face up state. The logic chip 32 may be electrically connected to the first package substrate 20 through bumps 34. The logic chip 32 may be molded by a first molding layer 36. By insulating adhesion layers 43, the memory chips 42 may adhered to each other and adhered to a top surface of the second package substrate 40. The memory chips 42 may be electrically connected to the second package substrate 40 through bonding wires 44. The memory chips 42 may be molded by a second molding layer 46. The first package substrate 20 and the second package substrate 40 may be electrically connected to each other through solder balls 38. At least one first external terminal 39 may adhered to a bottom surface of the first package substrate 20. The at least one first external terminal 39 may connect the thermoelectric cooling package 1 to an external device (e.g. a reference numeral 90 of FIG. 5B). The POP 80 structure may be replaced with another type of package or another type of semiconductor chip such as a package-in-package (PIP), a system-in-package (SIP), a system-on-chip (SOC), a chip-on-board (COB), a multi-chip package (MCP) or a board-on-chip (BOC). For example, a CPU or application processor (AP) may be coupled to the TEC 10 to constitute the thermoelectric cooling package 1.

The TEC 10 may include the P-type semiconductor 12$p$ and the N-type semiconductor 12$n$ which are combined with each other by the first metal layer 14. Each of the P-type semiconductor 12$p$ and the N-type semiconductor 12$n$ may be connected to the second metal layer 16. The TEC 10 may occupy or may be disposed along a side edge of the first package substrate 20 in so that the second metal layers 16 are adjacent to the first package substrate 20 and the first metal layer 14 is connected to the heat sink 70. Metal vias 24 may be provided to the first package substrate 20 to be connected to the second metal layers 16, and second external terminals 29 may adhered to the bottom surface of the first package substrate 20 to be connected to the metal vias 24.

The heat sink 70 may be disposed on the TEC 10 to further extend onto the second molding layer 46. A thermal interface layer (TIM) 60 may be provided between the second mold layer 46 and the heat sink 70. The thermoelectric cooling package 1 may further include a temperature sensor 50 sensing a temperature of thermoelectric cooling package 1. The temperature sensor 50 may be embedded within the logic chip 32 or the first package substrate 20. In the thermoelectric cooling package 1, since a heat source may mainly be the POP 80, a temperature of the POP 80 may represent the temperature of the thermoelectric cooling package 1. Accordingly, the temperature of the POP 80 will be regarded as the temperature of the thermoelectric cooling package 1 unless stated otherwise, hereinafter.

Referring to FIG. 5B, the thermoelectric cooling package 1 may be electrically connected to a board 90 through the external terminals 29 and 39. The board 90 may include a memory module board, a mobile set board, and/or a computer main board. The thermoelectric cooling package 1 may be operated by a signal applied through the board 90. Heat may be generated from mainly the POP 80 according to the operation of the thermoelectric cooling package 1. The heat generated from the POP 80 may be discharged through the heat sink 70 and the TEC 10 may be operated for more effectively discharging heat.

In some exemplary embodiments, the TEC 10 may be operated by applying a positive voltage to the P-type semiconductor 12$p$ and applying a negative voltage to the N-type semiconductor 12$n$. The voltages may be directly applied to the second metal layers 160 or be applied to the second metal layers 160 through the second external terminals 39 and the metal vias 24. Under the condition of applying the voltages, the heat radiation may be generated above the TEC 10 and the heat absorption may be generated below the TEC 10. Thus, the heat generated from the POP 80 may be transferred into the TEC 10 along the first package substrate 20, and then the heat may be upwardly transferred along the TEC 10 to be discharged through the heat sink 70. The heat may not only be moved to the heat sink 70 through the TEC 10, but be directly moved to the heat sink 70 to be released. In other exemplary embodiments, a negative voltage may be applied to the P-type semiconductor 12$p$ and a positive voltage may be applied to the N-type semiconductor 12$n$, so that the heat absorption may above the TEC 10 and the heat radiation may be generated below the TEC 10. In this case, the heat may be downwardly moved along the TEC 10 to be discharged through the metal vias 24 and the board 90.

Cooling the POP 80 using the TEC 10 may be continuously performed during the operation of the POP 80 or be transiently performed at need, i.e., transiently performed based on need. In other words, the POP may be selectively operated depending on need. The continuous operation of the TEC 10 may render the TEC 10 itself as heat source to drop cooling capacity and/or may induce a deformation of or thermal stress in the TEC 10 due to temperature difference between top and bottom ends thereof. According to exemplary embodiment, the TEC 10 may be performed transiently to solve the problems described above. Alternatively, a clock speed of the logic chip 32 may be reduced to cool the POP 80. Thus, dynamic thermal management (DTM) of the thermoelectric cooling package 1 may adopt a hardware method using the TEC 10 and a software method using the control of the clock speed.

The DTM of the thermoelectric cooling package 1 may be performed using the software method of reducing the clock speed of the logic chip 32 when the temperature of the POP 80 increases and increasing the clock speed of the logic chip 32 when the temperature of the POP 80 decreases. In this case, the clock speed (clock frequency) of the logic chip 32 may be changed to decrease performance of the thermoelectric cooling package 1. Accordingly, the DTM according to the present exemplary embodiment may adopt the hardware method, or a mixed method of the software method and the hardware method.

[Example of DTM]

Figure 5C:
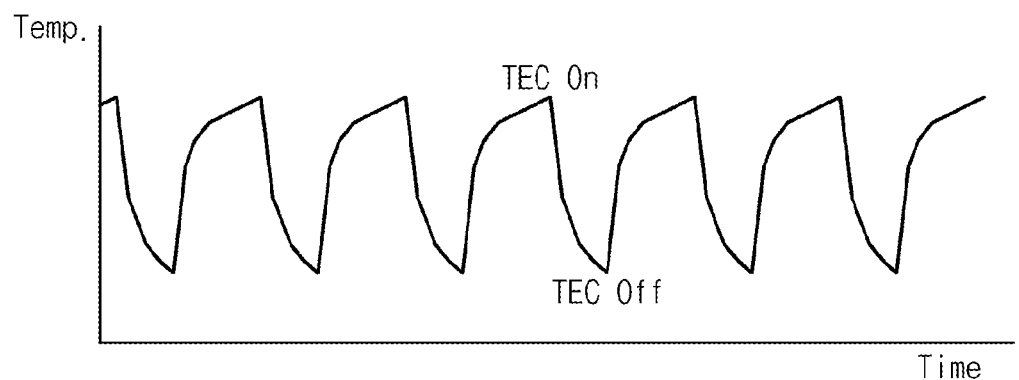
FIGS. 5C and 5F are graphs illustrating a temperature variation of a thermoelectric cooling package according to exemplary embodiments of the inventive concept.
Figure 5D:
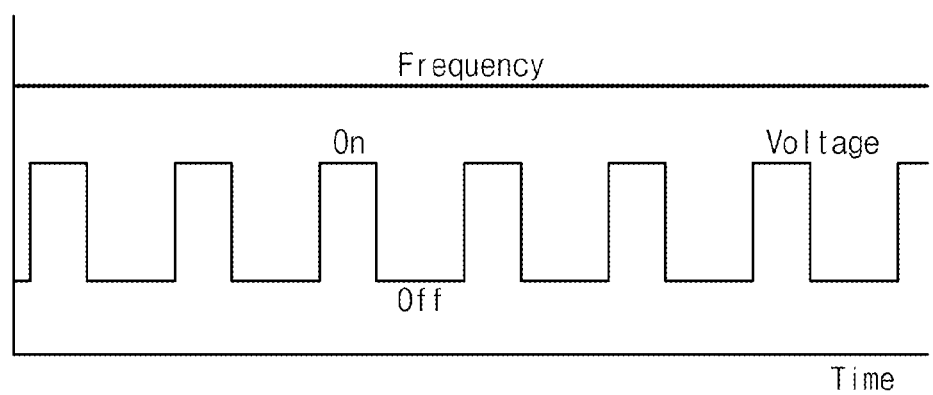
FIGS. 5D and 5G are graphs illustrating variations of a clock frequency and voltage supplied to a thermoelectric cooler of a thermoelectric cooling package according to exemplary embodiments of the inventive concept.
Figure 5E:
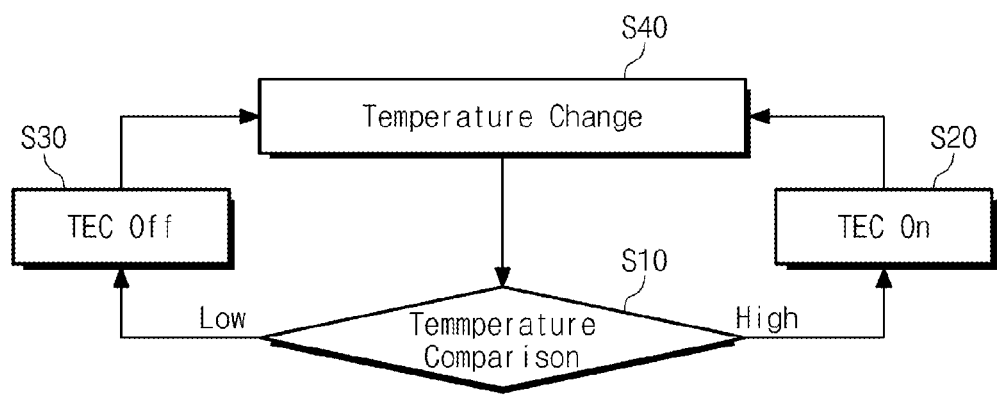
FIG. 5E is a flow chart illustrating a method of a feedback temperature control method of a thermoelectric cooling package according to exemplary embodiments of the inventive concept.
Figure 5F:
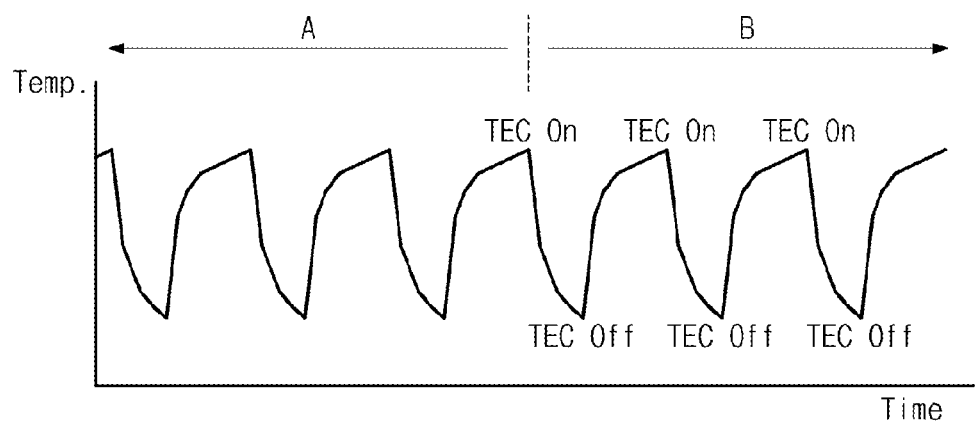
Figure 5G:
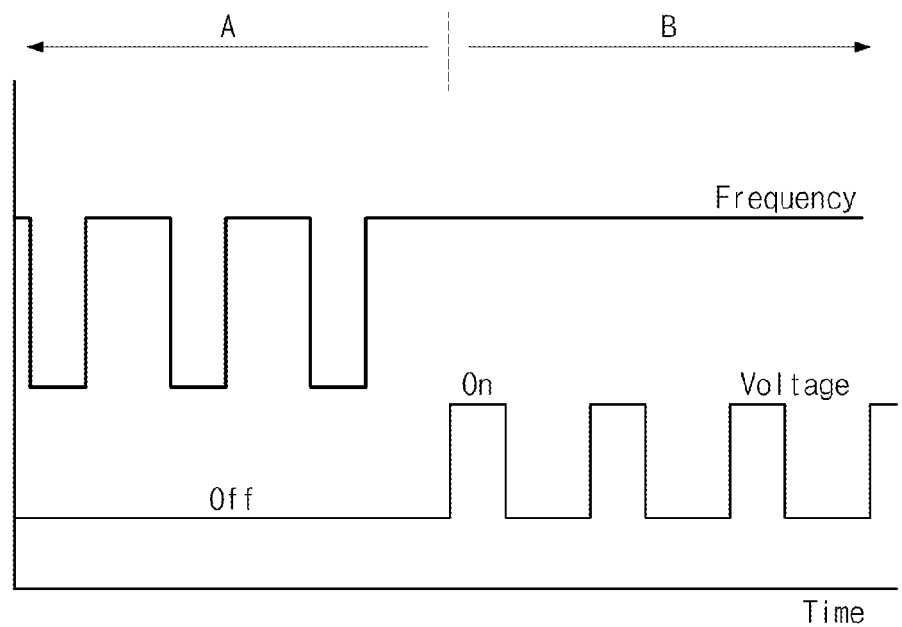

FIGS. 5C and 5F are graphs illustrating a temperature variation of a thermoelectric cooling package according to exemplary embodiments of the inventive concept. FIGS. 5D and 5G are graphs illustrating variations of a clock frequency and voltage supplied to a thermoelectric cooler of a thermoelectric cooling package according to exemplary embodiments of the inventive concept. FIG. 5E is a flow chart illustrating a method of a feedback temperature control method of a thermoelectric cooling package according to exemplary embodiments of the inventive concept.

Referring to FIGS. 5B through 5D, when the temperature of the POP 80 is increased by the use of the thermoelectric cooling package 1, the dynamic thermal management may be realized by the hardware method which includes operating the TEC 10 by supplying voltages to reduce the temperature of the POP 80 (FIG. 5C). In this case, the clock speed of the logic chip 32 may not be changed to maintain the performance of the thermoelectric cooling package 1 (FIG. 5D). As described above, when the hardware method is adopted, the TEC 10 may receive a transient voltage supply for transient operation.

In some exemplary embodiments, as illustrated in FIG. 5E, the temperature of the POP 80 measured by the temperature sensor 50 may be compared with a target temperature (or a target temperature range) (S10). If the measured temperature is higher than the target temperature (or the target temperature range), the TEC 10 receives the voltage supply (S20) to operate the TEC 10. If the measured temperature is lower than the target temperature (or the measured temperature is within or lower than the target temperature range), the operation of the TEC 10 is stopped by stopping the voltage supply (S30). Thus, the temperature of the POP 80 may be changed to be within the permissible range (S40). The transient operation of the TEC 10 described above may be performed once, or several times as illustrated in FIG. 5C. As a result, the temperature of the POP 80 may be changed at a temperature equal to or lower than the target temperature. The target temperature means a permissible maximum temperature at which the thermoelectric cooling package 1 is not overheated. The target temperature range means a temperature range within which it is possible to operate the thermoelectric cooling package 1 normally. In other exemplary embodiments, the TEC 10 may be continuously operated to suppress a temperature increase of the POP 80. As described above, the DTM may adopt the hardware method and the TEC 10 may be transiently or continuously operated.

Referring to FIGS. 5F and 5G, the software method and the hardware method may be mixed to perform the DTM. For example, when a high performance of the POP 80 is not required, the clock speed of the logic chip 32 is reduced to lower the temperature of the POP 80 without operating the TEC 10 (A). When the high performance of the POP 80 is required, the TEC 10 may receive a transient voltage supply for transient operation, to reduce the temperature of the POP 80 without the reduction of the clock speed (B).

[Other Examples of DTM]

FIGS. 5H to 5O are graphs illustrating variations of a clock frequency and voltage supplied to a thermoelectric cooler of a thermoelectric cooling package according to exemplary embodiments of the inventive concept.

Figure 5H:
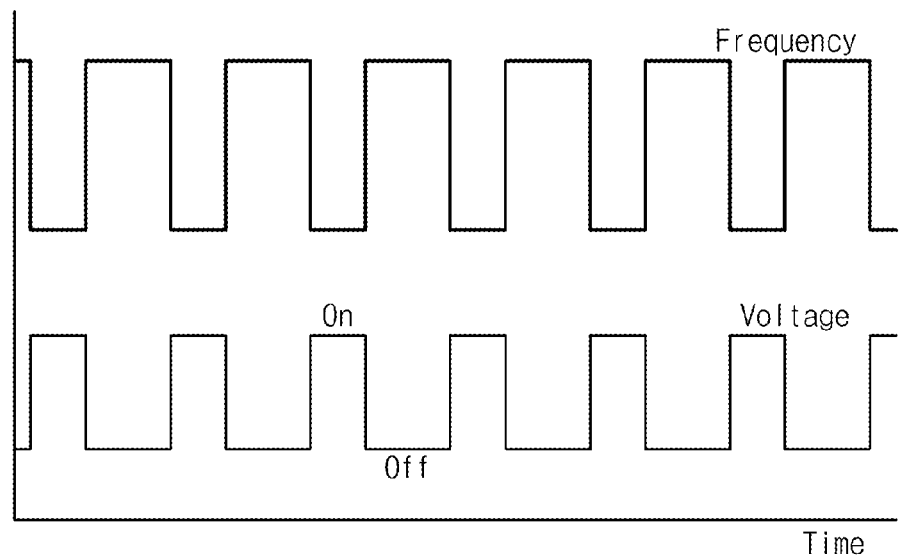

Referring to FIG. 5H, the software method and the hardware method may be performed simultaneously. For example, the clock speed of the logic chip 32 may be reduced and the TEC 10 may be operated at the same time, thereby rapidly reducing the temperature of the POP 80. The reduction of the clock speed and the operation of the TEC 10 may be transiently performed.

Figure 5I:
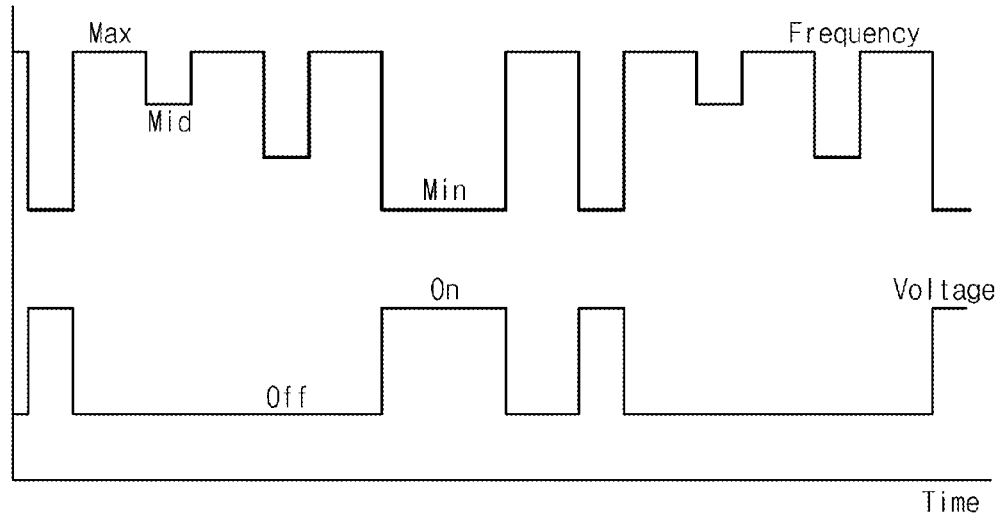

Referring to FIG. 5I, the clock speed of the logic chip 32 may be reduced from a maximum to a minimum or a medium to decrease the temperature of the POP 80. When the clock speed of the logic chip 32 is reduced to a medium, the temperature of the POP 80 may be within the permissible range. Therefore, the TEC 10 may receive a transient voltage supply for transient operation, to decrease the temperature of the POP 80 in case that the clock speed of the logic chip 32 may be reduced to a minimum.

Figure 5J:
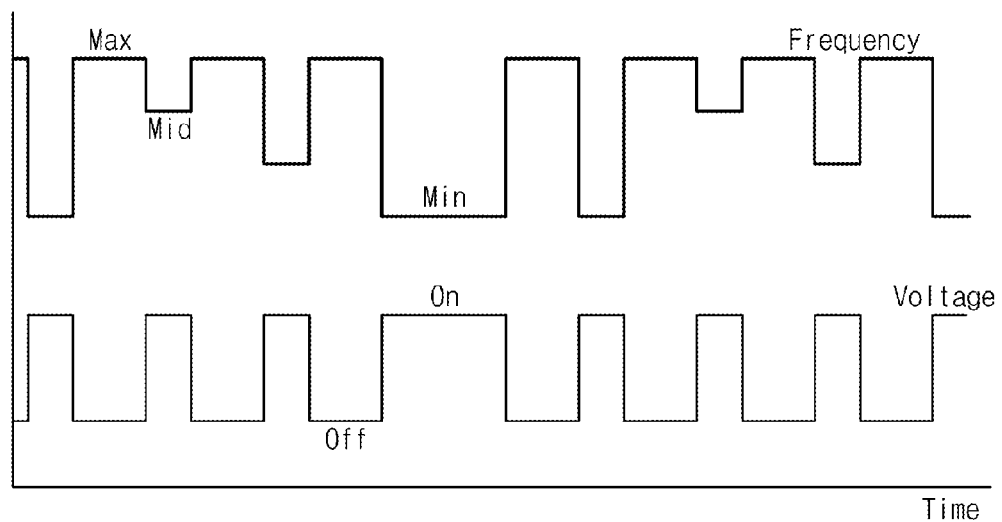

Referring to FIG. 5J, the clock speed of the logic chip 32 may be transiently reduced to from a maximum to a minimum or a medium during the operations of the logic chip 80 without much decrease in performance of the POP 80. If the temperature of the POP 80 is not within the permissible range, voltage may be additionally supplied to the TEC 10 for transient operation of the TEC 10. This supplementary operation of the TEC 10 may decrease the temperature of the POP 80 without additional decrease of the clock speed thereof. Alternatively, the TEC 10 may also receive a transient voltage supply for transient operation, even though the clock speed of the logic chip 32 is reduced to a medium.

Figure 5K:
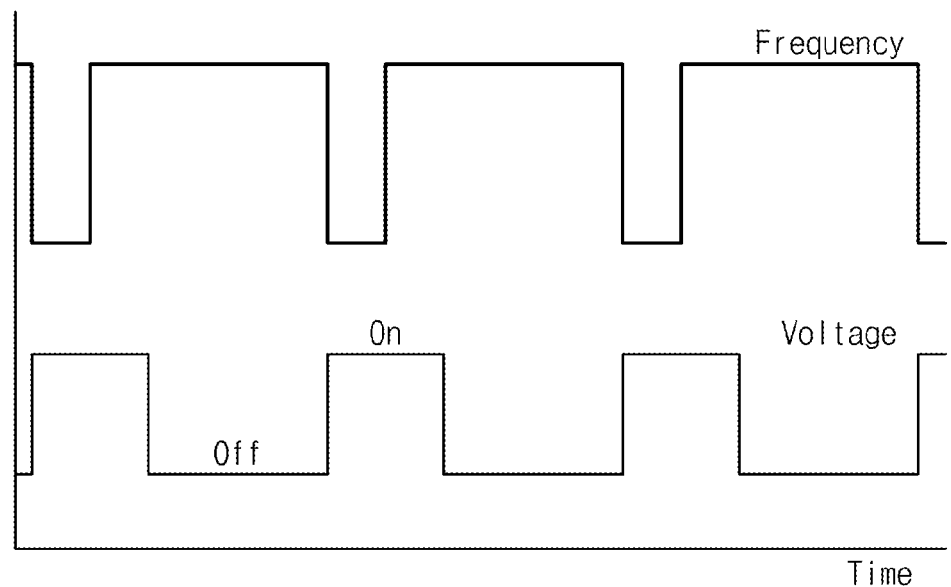

Referring to FIG. 5K, the clock speed of the logic chip 32 may be reduced concurrently with the transient operation of the TEC 10, which decreases the temperature of the POP 80. In this case, a supply time of voltage to the TEC 10 may be longer than a duration time of the low clock speed of the logic chip 30. According to exemplary embodiment, the performance of the thermoelectric package 1 may be maintained with minimum fluctuation of the clock speed of the logic chip 32.

Figure 5L:
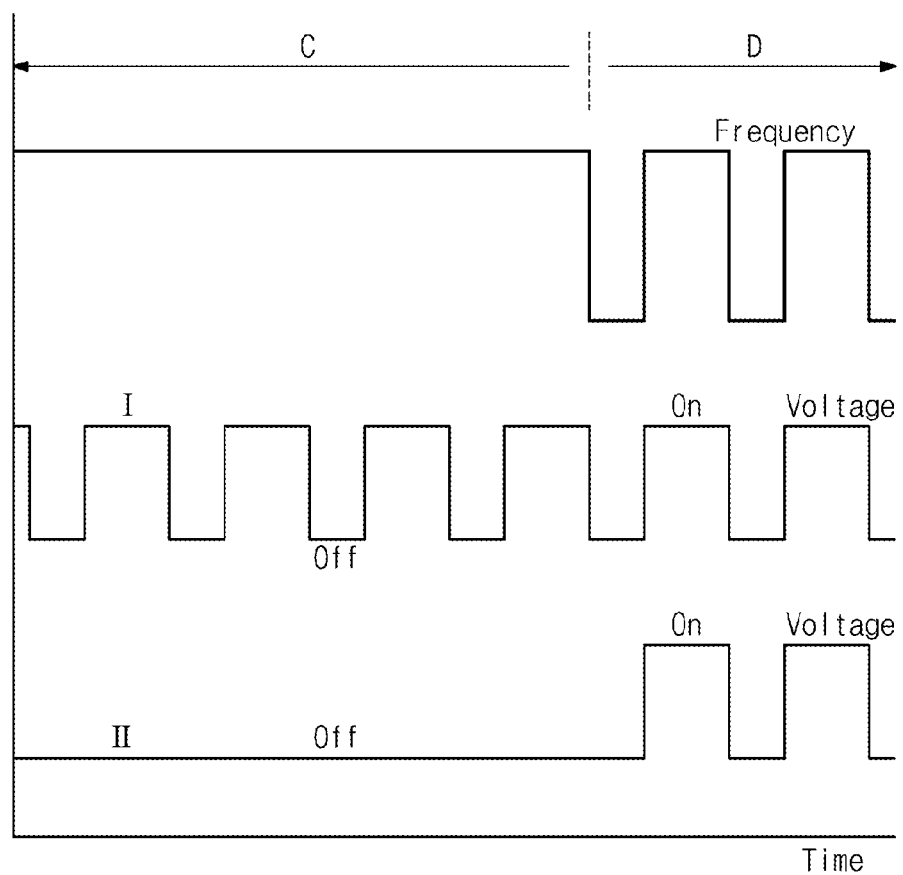

Referring to FIG. 5L, the POP 80 may be cooled by transient operation of the TEC 10 without intentional reduction of the clock speed of the logic chip 32. In an exemplary embodiment, there may be a single TEC 10 or may be a plurality of TECs. For example, the clock speed of the logic chip 32 may be kept at a high state (C) and then changed up and down (D). In the fluctuation state D of the clock speed, the TEC 10 may receive a transient voltage supply for transient operation, to decrease the temperature of the POP 80 when the clock speed is kept high. In the high state C of the clock speed, the TEC 10 may be transiently operated (I) or not operated (D). For example, the TEC 10 may be transiently operated if the temperature of the POP 80 increases to be greater than the permissible range. Alternatively, the TEC 10 may be not operated if the temperature of the POP 80 is within the permissible range.

Figure 5M:
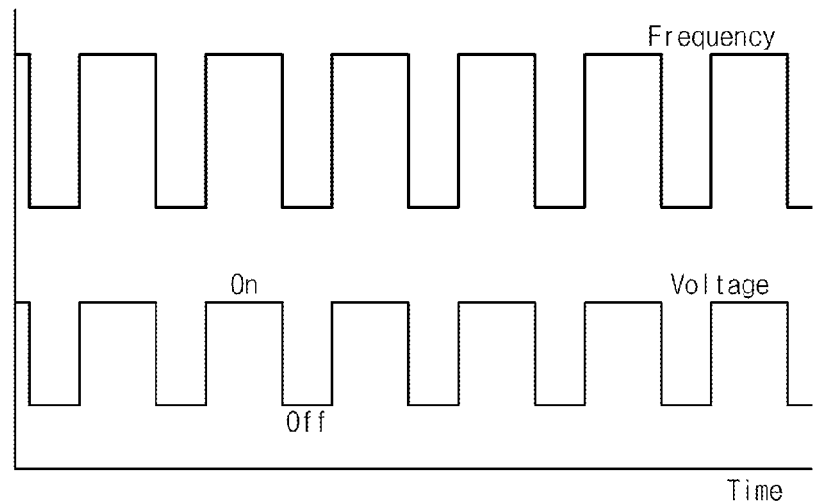

Referring to FIG. 5M, the high clock speed of the logic chip 32 may be synchronous with the voltage supply to the TEC 10 to cool the POP 80 without intentional drop of the clock speed thereof. As an exemplary embodiment, a transient voltage may be supplied to the TEC 10 when the clock speed of the logic chip 32 is high, and the voltage supplied to the TEC 10 may be removed or no voltage may be supplied to the TEC 10 when the clock speed of the logic chip 32 is low. Alternatively, if the temperature of the POP 80 is within the permissible range, the voltage supplied to the TEC 10 may be removed or no voltage may be supplied to the TEC 10 even though the clock speed of the logic chip 32 is high.

Figure 5N:
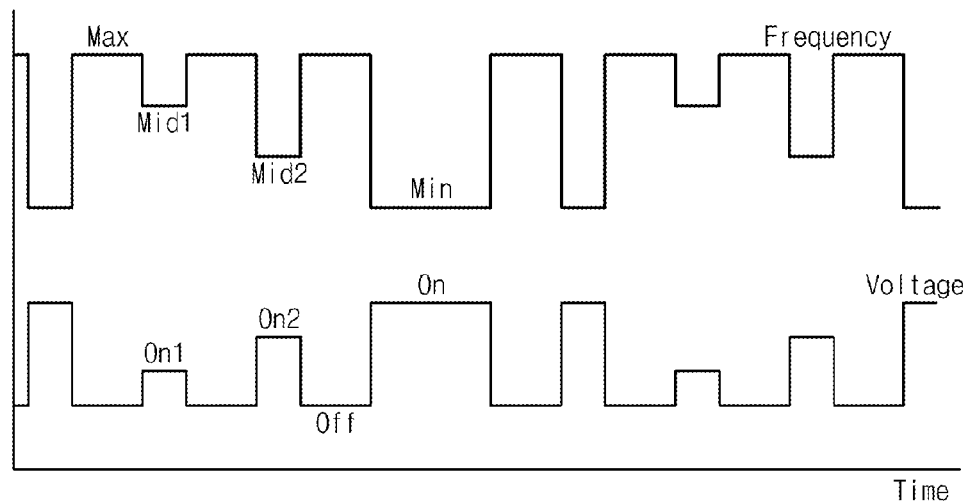
Figure 50:
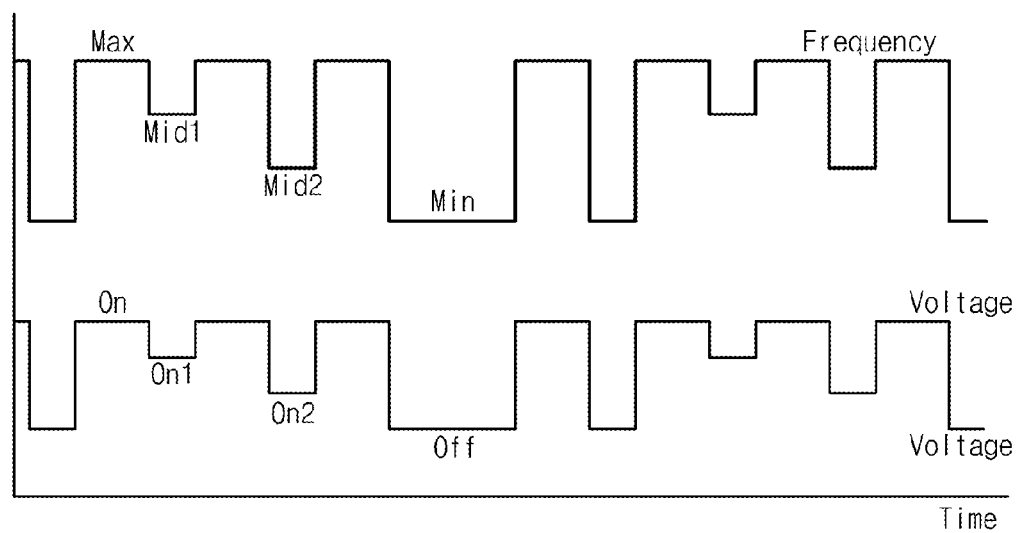

According to FIG. 5N, the POP 80 may be cooled by clock speed drop of the logic chip 32 and the transient operation of the TEC 10. The TEC 10 may be supplied with different magnitudes of voltage. For example, the magnitude of voltage when the clock speed is decreased to a medium may be smaller than that of voltage when the clock speed is lowered to a minimum. When the clock speed of the logic chip 32 is decreased to a first medium (mid1), the TEC 10 may be supplied with a first voltage value (on1). When the clock speed of the logic chip 32 is lowered to a second medium (mid2) smaller than the first medium (mid1), the TEC 10 may be supplied with a second voltage value (on2) greater than the first voltage value (on1). Both of the first voltage value (on1) and the second voltage value (on2) may be smaller than a voltage value (on) supplied to the TEC 10 when the clock speed of the logic chip 32 is decreased to minimum. As such, the magnitude of voltage may be inversely proportional to the clock speed.

According to FIG. 5O, the POP 80 may be cooled by the transient operation of the TEC 10 without the intentional drop of the clock speed of the logic chip 32. The TEC 10 may be supplied with different magnitudes of voltage. For example, the magnitude of voltage when the clock speed is decreased to a medium may be smaller than that of voltage when the clock speed is increased to a maximum. When the clock speed of the logic chip 32 is decreased to a first medium (mid1), the TEC 10 may be supplied with a first voltage value (on1). When the clock speed of the logic chip 32 is lowered to a second medium (mid2) smaller than the first medium (mid1), the TEC 10 may be supplied with a second voltage value (on2)

smaller than the first voltage value (on1). Both of the first voltage value (on1) and the second voltage value (on2) may be smaller than a voltage value (on) supplied to the TEC 10 when the clock speed of the logic chip 32 is increased to a maximum. As such, the magnitude of voltage may be proportional to the clock speed.

The exemplary embodiments of DTM may be implement in the thermoelectric package 1. Alternatively, the exemplary embodiments of DTM may be adopted to electronic devices such as mobile phones and display apparatus, e.g., LCD, PDP, OLED, AMOLED, etc., which are coupled with the thermoelectric package 1. In other exemplary embodiments, the DTM may be applicable to control temperature of diverse controllers including temperature controllers.

[Example of DTM Algorithm]

Figure 5P:
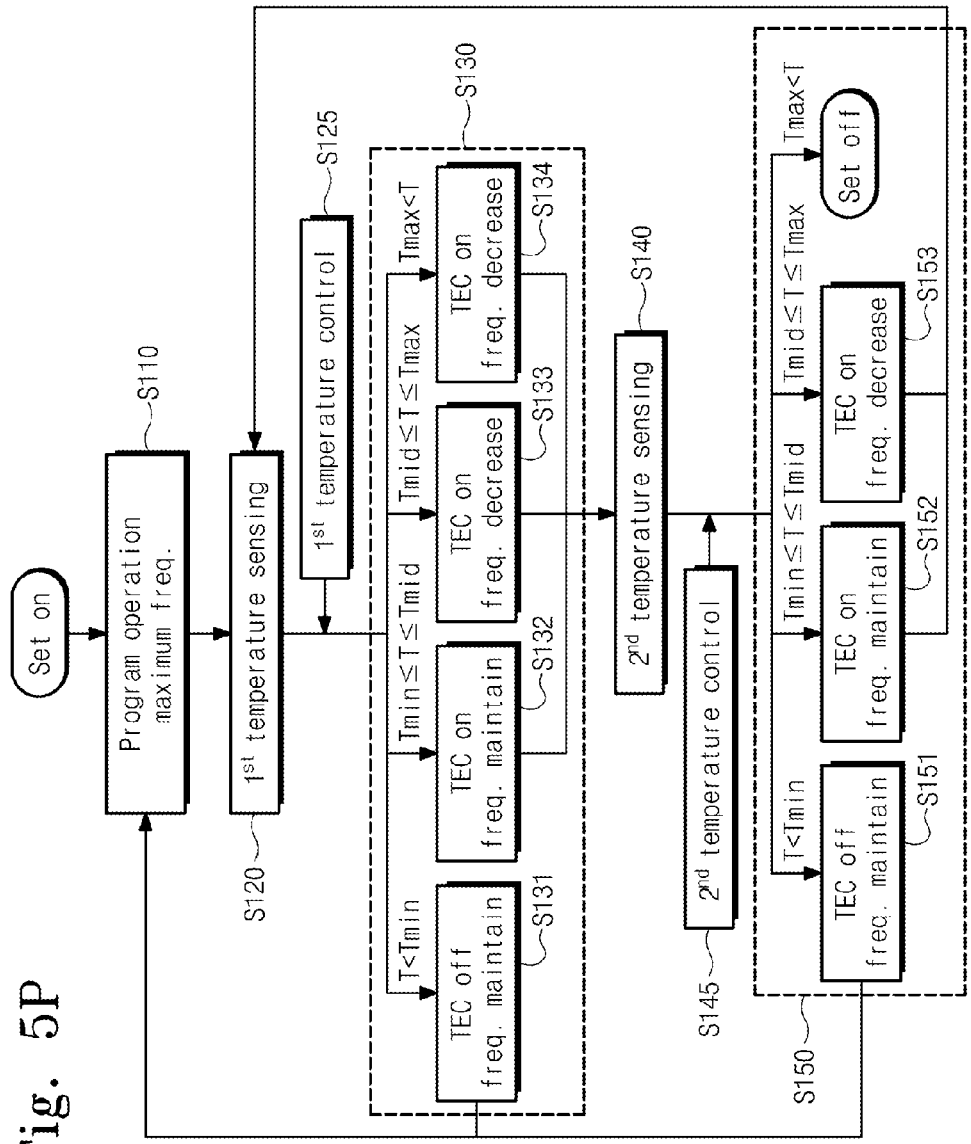
FIGS. 5P and 5Q are flow charts illustrating examples of dynamic temperature management according to exemplary embodiments of the inventive concept.

FIG. 5P is a flow chart illustrating examples of DTM according to exemplary embodiments of the inventive concept.

Referring to FIG. 5P, the thermoelectric cooling package 1 may be thermally managed with multi-stage temperature control as follows. According to exemplary embodiments of the inventive concept, a minimum temperature Tmin may be a temperature of the thermoelectric cooling package 1 corresponding to the minimum clock speed of the logic chip 32. Similarly, a maximum temperature Tmax and a medium temperature Tmid may be temperatures of the thermoelectric cooling package 1 corresponding to the maximum and medium clock speeds of the logic chip 32, respectively.

At an operation S110, the thermoelectric cooling package 1 may be operated during the maximum performance level of the logic chip 32. For example, the thermoelectric cooling package 1 may be operated with the maximum clock speed of the logic chip 32.

At an operation S120, a temperature of the thermoelectric cooling package 1 may be first measured in a first temperature sensing. The temperature of the thermoelectric cooling package 1 may be measured through the temperature sensor 50. After the operation S120, an operation S130 may be performed or an operation S125, and the feedback temperature control described in FIG. 5E, may further be performed before the operation S130.

At the operation S130, operation conditions of the thermoelectric cooling package 1 may be maintained when the temperature T of the thermoelectric cooling package 1 is less than the Tmin. Alternatively, the thermoelectric cooling package 1 may be cooled through both the transient operation of the TEC 10 and the reduction of the clock speed of the logic chip 32 when the T is greater than the Tmin. The operation S130 may be divided into operations S131 to S134 described below.

At the operation S131, the TEC 10 may not be operated and the clock speed of the logic chip 32 may not be changed when the T is less than the Tmin. In this case, the thermoelectric cooling package 1 may be operated during the maximum performance level of the logic chip 32 like in the operation S110.

At the operation S132, the thermoelectric cooling package 1 may be cooled through the transient operation of the TEC 10 when the T is in the range from the Tmin to the Tmid. According to some exemplary embodiments, the clock speed of the logic chip 32 may be maintained so that thermoelectric cooling package 1 may be operated during the maximum performance level of the logic chip 32 at the operation S132.

At the operation S133, the TEC 10 may be transiently operated and the clock speed of the logic chip 32 may be reduced when the T is in the range from the Tmid to the Tmax.

At the operation S134, the TEC 10 may be transiently operated and the clock speed of the logic chip 32 may be reduced when the T is greater than the Tmax.

At an operation S140, there may be temperature measurement of the thermoelectric cooling package 1 in a second temperature sensing, which is passed through the operations S132, S133 and S134. After the operation S140, an operation S150 may be performed or an operation S145, the feedback temperature control described in FIG. 5E, may further be performed before the operation S150.

At the operation S150, the thermoelectric cooling package 1 may be returned to the operation S110 when the T is less than the Tmin. Alternatively, the thermoelectric cooling package 1 may be cooled through both the transient operation of the TEC 10 and the drop of the clock speed of the logic chip 32 when the T is higher than the Tmin. The operation S150 may be divided into operations S151 to S154 described below.

At the operation S151, the voltage may no longer be applied to the TEC 10 when the T is less than the Tmin. In this case, the maximum clock speed of the logic chip 32 may be maintained such that the thermoelectric cooling package 1 may be operated during the maximum performance level of the logic chip, like in the operation S110. Meanwhile, the clock speed of the logic chip 32 may be increased to the maximum and then the thermoelectric cooling package 1 may be operated in full speed when the clock speed of the logic chip 32 is lower than the maximum.

At the operation S152, the thermoelectric cooling package 1 may be cooled through the transient operation of the TEC 10 when the T is in the range from the Tmin to the Tmid. According to some embodiments, the clock speed of the logic chip 32 may be maintained.

At the operation S153, the TEC 10 may be transiently operated and the clock speed of the logic chip 32 may be drop when the T is in the range from the Tmid to the Tmax.

At the operation S154, the voltage applied to the thermoelectric cooling package 1 may be cut off when the T is greater than the Tmax.

According to some exemplary embodiments, the Tmid may not be defined. In this case, one of the operations S132 and S133 may be excluded and one of the operations S152 and S153 may be excluded. For example, the operation S130 may comprise the operations S131, S133 and S134 except the operation S132 and the operation S150 may comprise the operations S151, S153 and S154 without the operation S153. As another example, the operation S130 may comprise the operations S131, S132 and S134 except the operation S133 and the operation S150 may comprise the operations S151, S152 and S154 without the operation S152.

[Another Example of DTM Algorithm]

Figure 5Q:
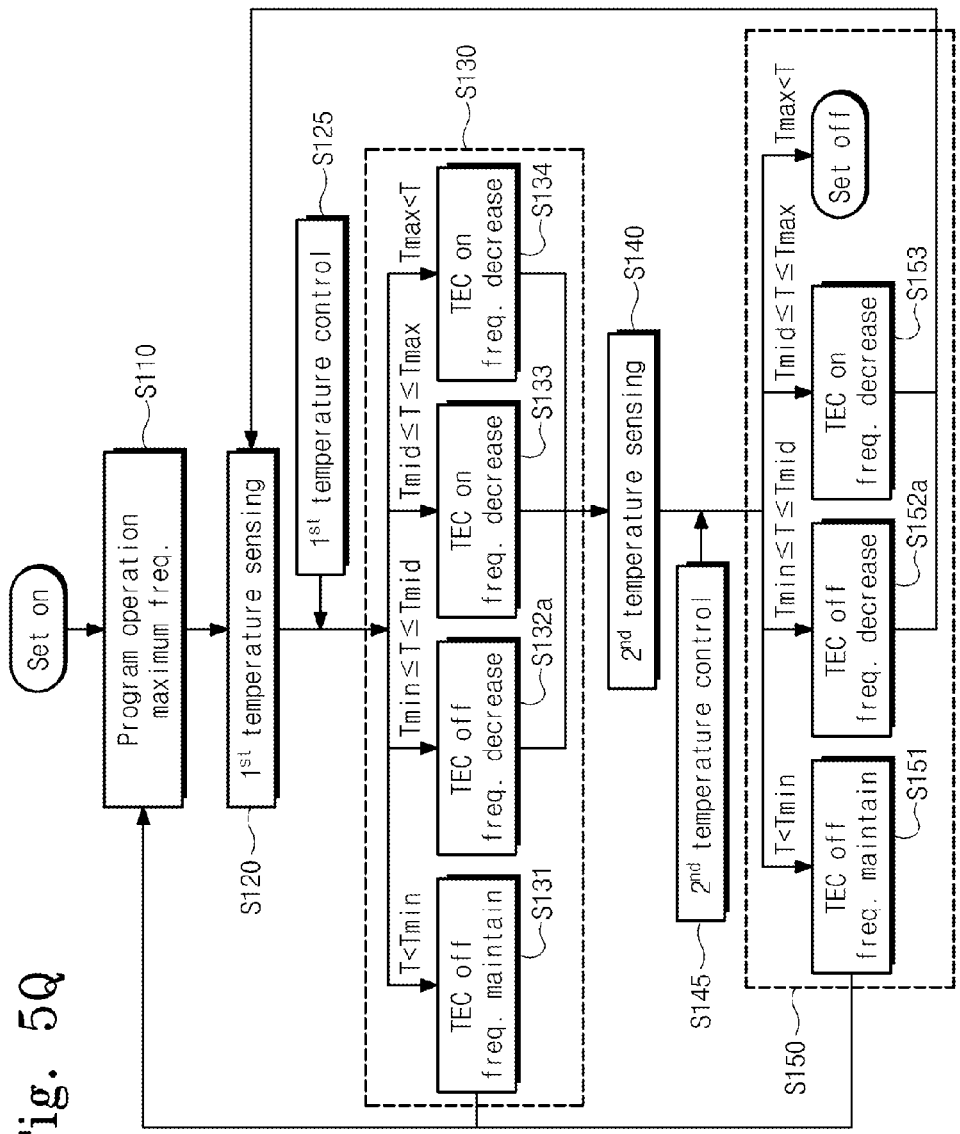

FIG. 5Q is a flow charts illustrating examples of dynamic temperature management according to exemplary embodiments of the inventive concept.

Referring to FIG. 5Q, if the temperature of the thermoelectric cooling package 1 during the operation of the logic chip 32 at full maximum speed, increases to a range from the Tmin to the Tmid, the clock speed of the logic chip 32 may be decreased (S132*a*). If the temperature T of the thermoelectric cooling package 1 thermally managed in the operation S130 is diposed between the Tmin and the Tmid, the clock speed of the logic chip 32 may be decreased (S152*a*). According to some exemplary embodiments, the thermoelectric cooling package 1 may be cooled through the decrease of the clock speed of the logic chip 32 without the operation of the TEC 10 at the operations S132*a* and S152*a*. The description of features that are the same as or similar to those in FIG. 5P may apply to this exemplary embodiment of FIG. 5Q.

[Applications of Thermoelectric Cooling Package]

Figure 6A:
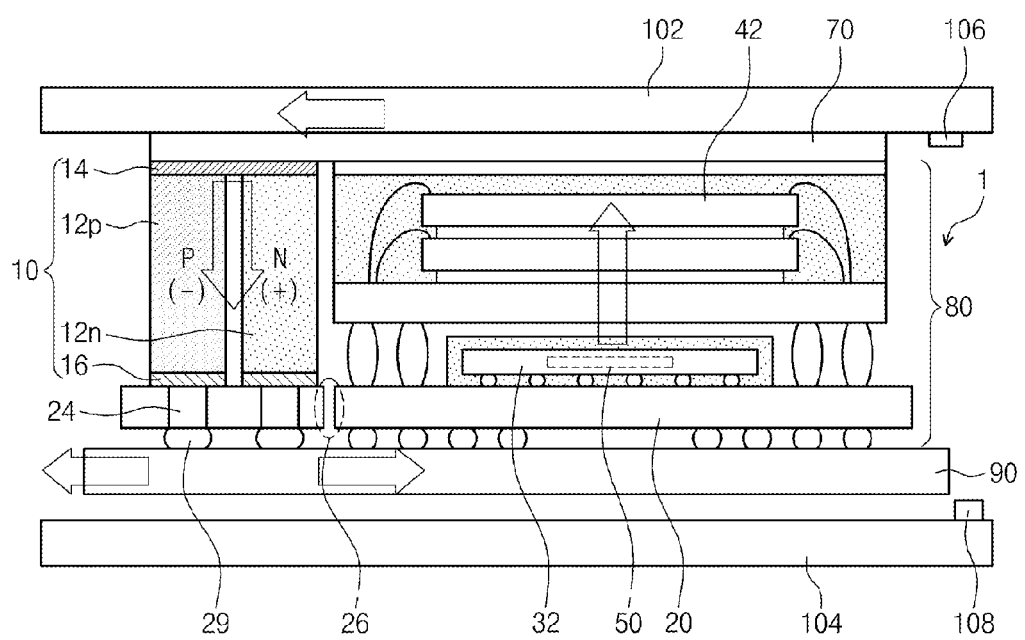
FIGS. 6A and 6B are cross sectional views illustrating examples of applications of a thermoelectric cooling package according to exemplary embodiments of the inventive concept.
Figure 6B:
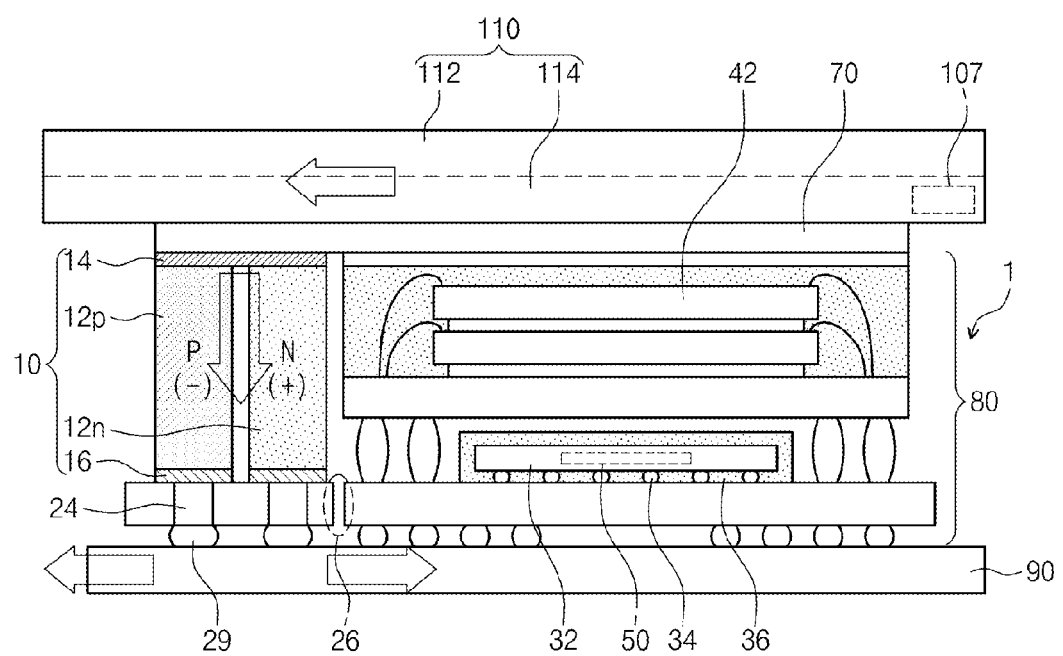
Figure 6C:
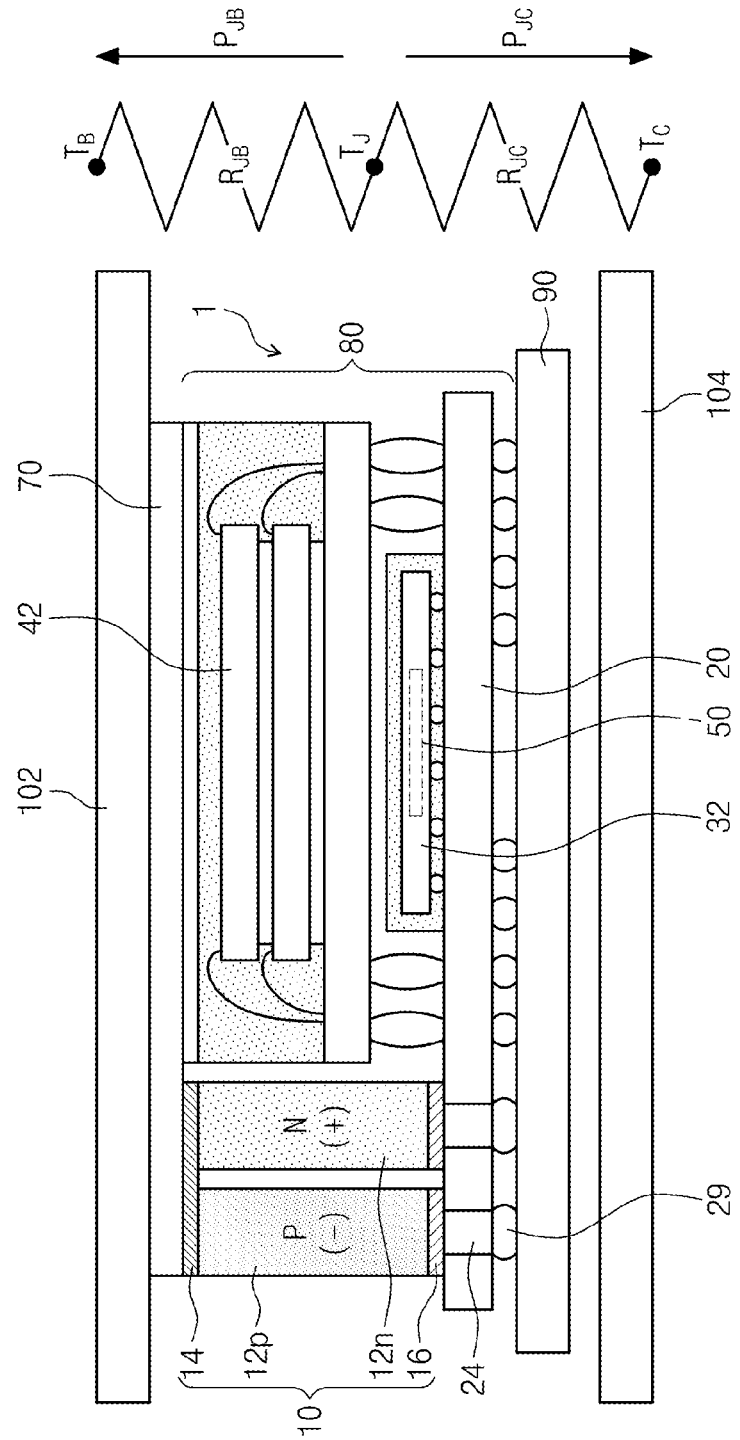
FIG. 6C is a cross sectional view illustrating an equivalent thermal circuit of an exemplary application of a thermoelectric cooling package according to exemplary embodiments of the inventive concept.

FIGS. 6A and 6B are cross sectional views illustrating examples of applications of a thermoelectric cooling package according to exemplary embodiments of the inventive concept. FIG. 6C is a cross sectional view illustrating an equivalent thermal circuit of an exemplary application of a thermoelectric cooling package according to exemplary embodiments of the inventive concept.

Referring to FIG. 6A, the thermoelectric cooling package 1 may be used in a handheld mobile electronic device such as a mobile phone, a portable multimedia player (PMP) and/or a portable tablet. For example, the thermoelectric cooling package 1 may be mounted on a mobile set board 90 to be installed between an upper casing 102 and a lower casing 104. When the POP 80 may be operated for performing various functions of the mobile phone, the POP 80 may be operated. The logic chip 32 may comprise an application processor (AP) which is capable of operating for driving the thermoelectric cooling package 1, and at least one of the memories 142 may comprise a DRAM as a working memory of the logic chip 32. When the thermoelectric cooling package 1 is operated, the heat generated from the POP 80 may be mainly transmitted to the upper casing 102 so that the upper casing 102 may become hotter than a reference temperature or target temperature. Since the mobile phone is grasped by a user, the reference temperature may mean a maximum temperature (e.g. about 45° C.) at which the user can comfortably endure when the user grasps the mobile phone. The reference temperature may be measured by the temperature sensor 50. For example, when the temperature measured by the temperature sensor 50 may be equal to or higher than a predetermined value, it may be predicted that the temperature of the upper casing 102 will be equal or higher than the reference temperature. Alternatively, the temperature of the upper casing 102 may be measured by a temperature sensor 106 adhered to the upper casing 102, and/or the temperature of the lower casing 104 may be measured by a temperature sensor 108 adhered to the lower casing 104. The reference temperature may be directly measured by at least one of the sensors 50, 106 and 108. Alternatively, the reference temperature may be set based on some criteria described later with reference to FIG. 6C.

If the temperature of the upper casing 102 is equal to or higher than the reference temperature, a negative voltage may be applied to the P-type semiconductor 12p and a positive voltage may be applied to the N-type semiconductor 12n. The TEC 10 may be transiently or continuously operated the voltages are supplied. Thus, the heat may downwardly flow along the TEC 10, so the temperature of the upper casing 102 may become lower than the reference temperature. The heat may be more effectively transmitted to the TEC 10 from the upper casing 102 by the heat sink 70.

As other examples, the reference temperature may be a mixed temperature of the POP 80 and the upper casing 102. According to exemplary embodiments included this application, the reference temperature or temperature measuring area may be not restricted to a specific point.

The first package substrate 20 may include a first portion on which the logic chip 32 is mounted, and a second portion on which the TEC 10 is mounted. A boundary between the first portion and the second portion of the first package substrate 20 may be cut so that there is a gap 26 and so that the first package substrate 20 may be divided into two portions. The gap 26 may block a heat flow toward the POP 80 through the first package substrate 20. Alternatively, the first package substrate 20 may not be divided to two portions. In this case, the heat downwardly flowing along the TEC 10 may be transmitted to the mobile set board 95 mainly through the metal vias 24, thereby minimizing the heat flow toward the POP 80.

Referring to FIG. 6B, the thermoelectric cooling package 1 may be combined with a liquid crystal display 110. The liquid crystal display 110 may include a liquid crystal display portion 112 and a backlight unit 114, and the thermoelectric cooling package 1 may be installed on a back side of the liquid crystal display 110. When the thermoelectric cooling package 1 absorbs heat from the liquid crystal display 110, a negative voltage may be applied to the P-type semiconductor 12p and a positive voltage may be applied to the N-type semiconductor 12n, thereby transiently or continuously operating the TEC 10. Thus, the heat generated from the liquid crystal display 110 may be transmitted to mainly a board 90 through the TEC 10. The temperature of the liquid crystal display 110 may be measured by the temperature sensor 50 included in the thermoelectric package 1 or a temperature sensor 107 disposed in the liquid crystal display 10. The temperature sensor 107 may be embedded or attached to the liquid crystal display 10. The first package substrate 20 may or may not include the gap 26. The present exemplary embodiment is not limited to the liquid crystal display 110. The present embodiment may apply to other flat panel displays such as a plasma display panel (PDP), an active matrix organic light emitting diode (AMOLED), and/or a passive matrix organic light emitting diode (PMOLED).

Referring to FIG. 6C, assuming that the thermoelectric cooling package 1 mounted on the mobile set board 90 is disposed between the upper casing 102 and the lower casing 104. In some exemplary embodiments, the logic chip 32 may comprise the temperature sensor 50 and the casings 102 and 104 may not comprise temperature sensors.

The temperature sensor 50 may measure an internal temperature $T_J$ of the logic chip 32. A surface temperature $T_B$ of the upper casing 102 and/or a surface temperature $T_c$ of the lower casing 104 may be calculated by a thermal circuit modeling. For example, a relationship of the surface temperature $T_B$ of the upper casing 102 and the surface temperature $T_J$ of the lower casing 104 may be given by an Equation 1 below.

$$T_J = T_B + R_{JB} \times P_{JB} \qquad [Eq. 1]$$

wherein the $R_{JB}$ (Watt) is a thermal resistance between the temperature sensor 52 and the surface of the upper casing 102, and the $P_{JB}$ (° C./Watt) is a dissipation heat to the surface of the upper casing 102.

A relationship of the surface temperature $T_c$ of the lower casing 104 and the surface temperature $T_J$ of the lower casing 104 may be represented by an Equation 2 below.

$$T_J = T_c + R_{JC} \times P_{JC} \qquad [Eq. 2]$$

wherein the $R_{JC}$ is a thermal resistance between the temperature sensor 52 and the surface of the lower casing 104, and the $P_{JC}$ is a dissipation heat to the surface of the lower casing 104.

Considering the Equations 1 and 2, it may be possible to measure temperatures of various portions as well as the logic chip 32 through the heat transfer modeling. In other words, it may be easily set up reference temperatures of diverse sections in electronic devices. For example, if the upper casing 102 is replaced by a display of the mobile phone, a surface temperature of the display may be measured.

The thermoelectric cooling package 1 may be operated in multiple performance modes according to various reference temperatures. As one example, the thermoelectric cooling package 1 may be operated in maximum performance mode where the clock speed of the logic chip 32 is set to the maximum, in minimum performance mode where the clock speed of the logic chip 32 is set to the minimum, or in medium performance mode where the clock speed of the logic chip 32 is set to the medium.

In some exemplary embodiments, it is assumed that the thermoelectric cooling package 1 operates in the maximum performance mode. If the temperature of thermoelectric cooling package 1 is lower than a first reference temperature T1, the clock speed of the logic chip 32 may be maintained in the maximum state. Whereas, if the thermoelectric cooling package 1 is heated and its temperature is increased greater than the T1, the thermoelectric cooling package 1 may be operated in the medium performance mode changed from the maximum performance mode.

When the thermoelectric cooling package 1 is operated in the medium performance mode and its temperature is lower than a stable temperature Ts (<T1), the thermoelectric cooling package 1 may operated in the maximum performance mode changed from the medium performance mode. Alternatively, when the temperature of thermoelectric cooling package 1 is in the range from the Ts to a second reference temperature T2 (>T1), the operation state of the thermoelectric cooling package 1 may maintained so that the medium performance mode may continue. If the thermoelectric cooling package 1 is heated and then its temperature is increased greater than the T2, the thermoelectric cooling package 1 may operated in the minimum performance mode changed from the medium performance mode.

In case that the thermoelectric cooling package 1 is operated in the minimum performance mode and its temperature is lower than the Ts, the thermoelectric cooling package 1 may operated in the maximum performance mode changed from the minimum performance mode. Alternatively, if the temperature of thermoelectric cooling package 1 is in the range from the Ts to T2, the thermoelectric cooling package 1 may operated in the medium performance mode changed from the minimum performance mode. If when the temperature of thermoelectric cooling package 1 is in the range from the T2 to a third reference temperature T3 (>T2) which corresponds to the maximum permissible temperature $T_{JMAX}$ of the logic chip 32, the operation state of the thermoelectric cooling package 1 may maintained so that the minimum performance mode may go on. If the thermoelectric cooling package 1 is heated and its temperature increased more than the T3, the power applied to the thermoelectric cooling package 1 may be released.

The reference temperatures Ts, T1, T2 and T3 may be given by following Equations 3 to 6.

$$T_S \leq T_B + R_{JB} \times P_{JB} \text{ or } T_C + R_{JC} \times P_{JC} \quad \text{[Eq. 3]}$$

$$T1 \geq T_B + R_{JB} \times P_{JB} \text{ or } T_C + R_{JC} \times P_{JC} \quad \text{[Eq. 4]}$$

$$T2 \leq T_{JMAX} \quad \text{[Eq. 5]}$$

$$T3 \geq T_{JMAX} \quad \text{[Eq. 6]}$$

Alternatively, if the thermoelectric cooling package 1 operates in the maximum performance mode and then its temperature is increased above the T1, the thermoelectric cooling package 1 may be cooled below the T1 due to the transient operation of the TEC 10. In this case, the maximum performance mode of the thermoelectric cooling package 1 may be maintained. Similarly, if the thermoelectric cooling package 1 operating in the medium performance mode is heated and then its temperature is increased between the Ts and T2 or above than the T2, the thermoelectric cooling package 1 may be cooled due to the transient operation of the TEC 10. Therefore, the thermoelectric cooling package 1 may be maintained in the medium performance mode or maximum performance mode. According to the exemplary embodiment, even though the thermoelectric cooling package 1 may be heated above the T3, there may not be needed to stop the supply of the power to the TEC 10 because the thermoelectric cooling package 1 may be cooled below the T3 due to the transient operation of the TEC 10.

The descriptions of features that are the same as or similar to those in FIG. 6C may apply to exemplary embodiments described in this application. For example, the target temperature of FIG. 5E may be given by one of the Equations 1 to 6, e.g., the Equation 1 or 2.

The "thermoelectric cooling package" may mean the thermoelectric cooling package 1 comprising the TEC 10 and the POP 80 in a broad sense and any electronic or electric apparatus comprising the thermoelectric cooling package 1 such as the mobile phone illustrated in FIG. 6A or the display depicted in FIG. 6B in a narrow sense. Therefore, the thermal management described in this application may mean that a thermal management of the thermoelectric cooling package 1 itself or a thermal management of the electronic apparatus.

[Modified Exemplary Embodiments of Thermoelectric Cooling Package]

FIGS. 7A through 7D are cross sectional views illustrating modified embodiments of a thermoelectric cooling package according to exemplary embodiments of the inventive concept.

Figure 7A:
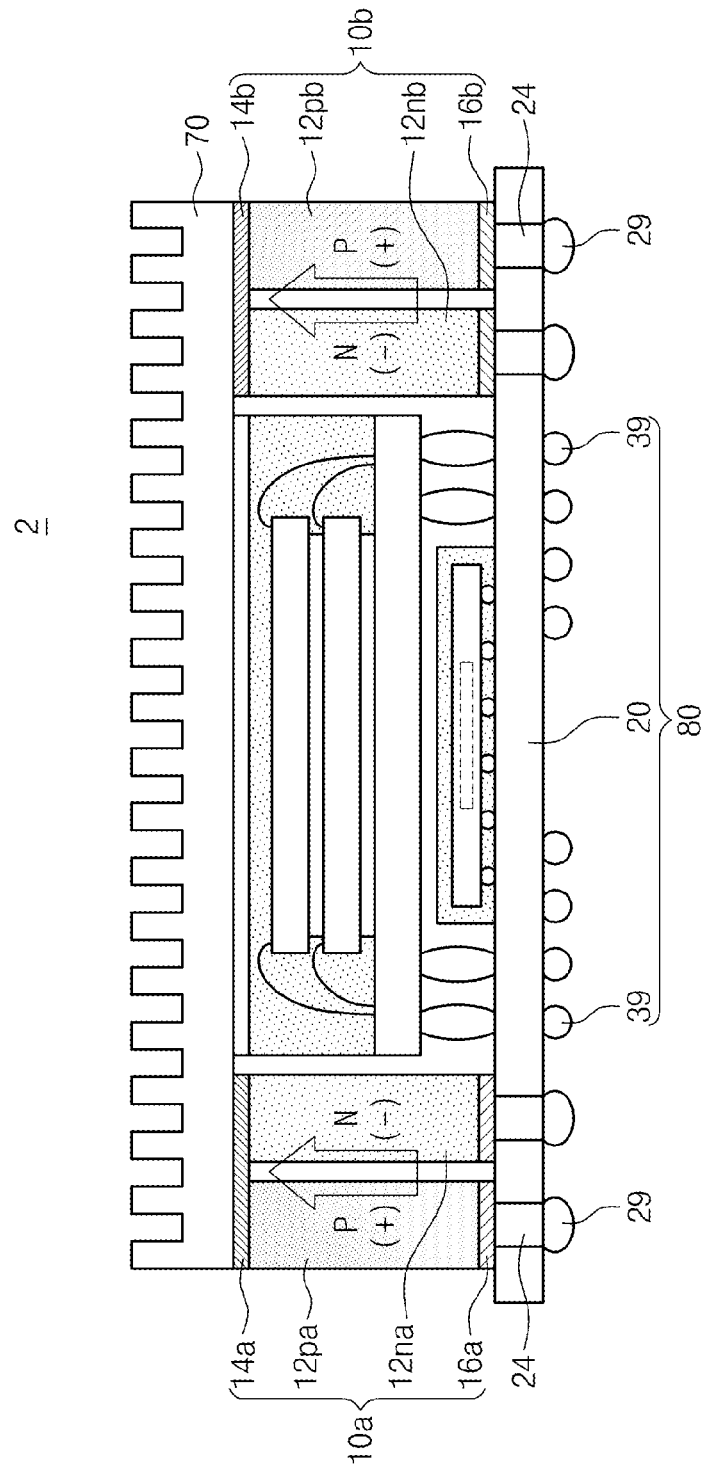
FIGS. 7A through 7D are cross sectional views illustrating modified exemplary embodiments of a thermoelectric cooling package according to exemplary embodiments of the inventive concept.

Referring to FIG. 7A, a thermoelectric cooling package 2 may include a plurality of TECs combined with the POP 80. For example, a first TEC 10*a* and a second TEC 10*b* may be disposed at about the both side edges of the first package substrate 20, respectively. A positive voltage may be applied to a P-type semiconductor 12*pa* of the first TEC 10*a* and a negative voltage may be applied to an N-type semiconductor 12*na* of the first TEC 10*a*, thereby discharging the heat generated from the POP 80. Likewise, a positive voltage may be applied to a P-type semiconductor 12*pb* of the second TEC 10*b* and a negative voltage may be applied to an N-type semiconductor 12*nb* of the second TEC 10*b*, thereby discharging the heat generated from the POP 80. Thus, the temperature of the POP 80 may be maintained under the target temperature or within the target temperature range. The first TEC 10*a* may be operated simultaneously with the second TEC 10*b* or be operated independently of the second TEC 10*b*.

Figure 7B:
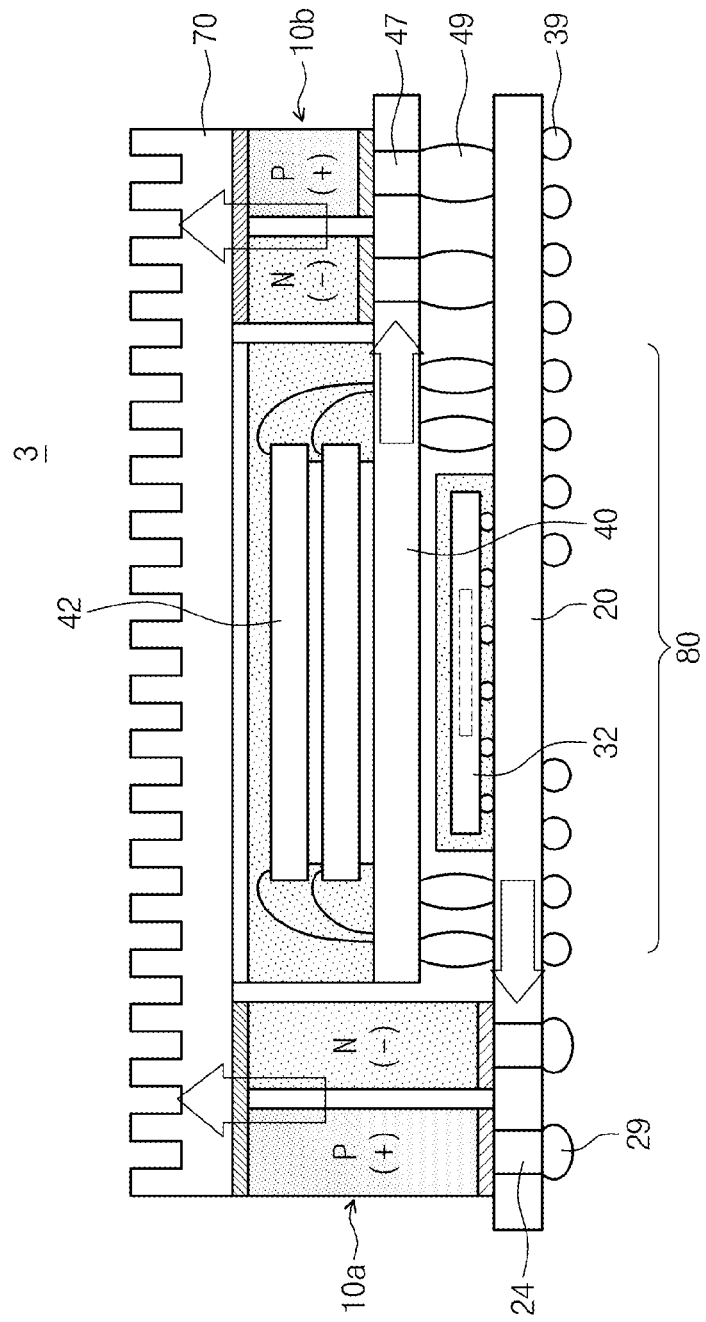

Referring to FIG. 7B, a thermoelectric cooling package 3 may include a first TEC 10*a* disposed on the first package substrate 20 and a second TEC 10*b* disposed on the second package substrate 40. The first TEC 10*a* may be disposed on a left side edge of the first package substrate 20 to mainly discharge the heat generated from the logic chip 32. The second TEC 10*b* may be disposed at about a right side edge of the second package substrate 40 to mainly discharge the heat generated from the memory chips 42. The second package substrate 40 may further include metal vias 47 connected to the second TEC 10*b*. Solder balls 49 electrically connected to the metal vias 47 may further be provided between the first package substrate 20 and the second package substrate 40. The metal vias 47 and the solder balls 49 may be used as transmission paths of the voltages applied to the second TEC 10*b*.

Figure 7C:
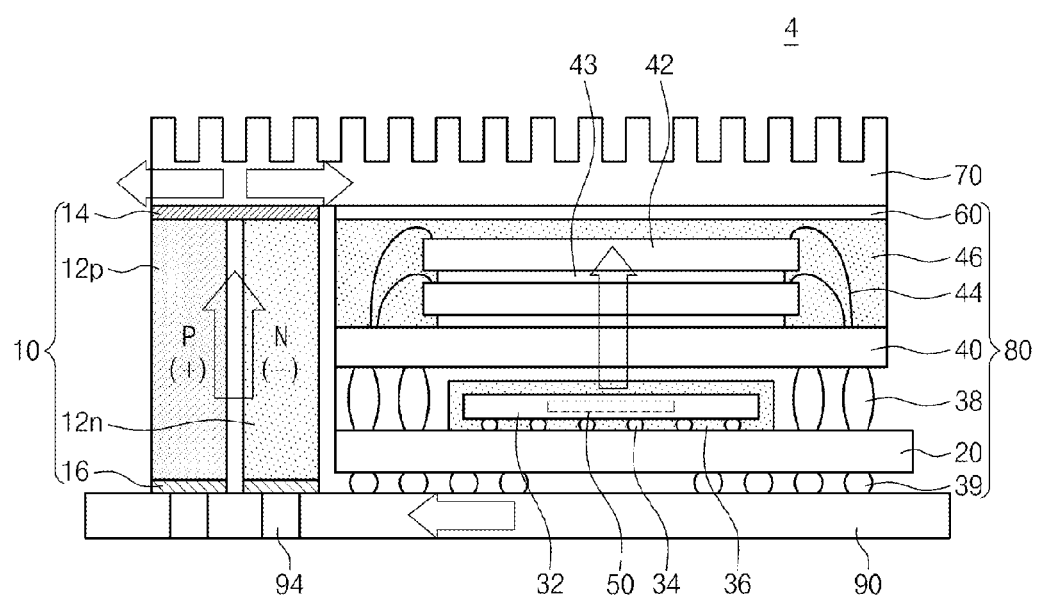

Referring to FIG. 7C, a thermoelectric cooling package 4 may include the TEC 10 which is not close to the POP 80. For example, the POP 80 may be disposed on the board 90 and the TEC 10 may be disposed outside the POP 80 on the board 90.

Accordingly, it may be possible to remove or minimize a phenomenon transmitting the heat upwardly or downwardly flowing through the TEC 10 or generated from the TEC 10 itself to the POP 80. The thermoelectric cooling package 4 may include the heat sink 70 commonly connected to the TEC 10 and the POP 80. The heat generated from the POP 80 may be discharged through the heat sink 70 or be transmitted to the board 90. The heat transmitted to the board 90 may be moved to the heat sink 70 through the TEC 10 to be released. The board 90 may further include metal vias 94 connected to the second metal layers 16. The metal vias 94 may perform functions as voltage applying terminals and/or thermal vias.

Figure 7D:
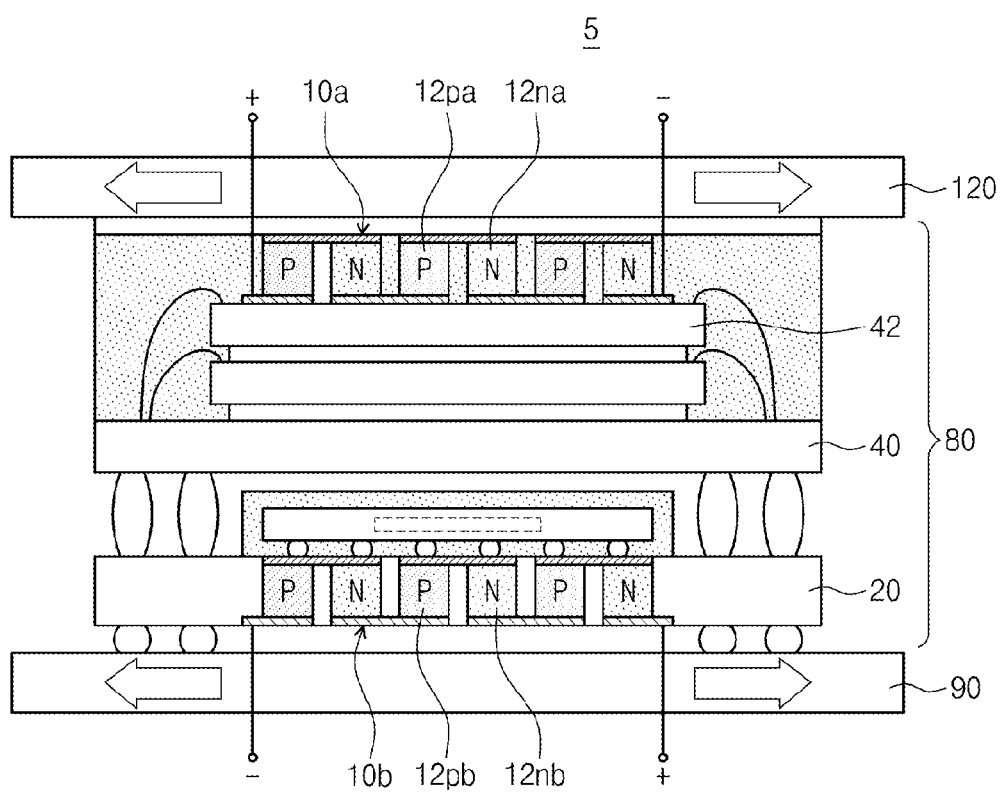

Referring to FIG. 7D, a thermoelectric cooling package 5 may include a first TEC 10a embedded in the POP 80. The first TEC 10a may be electrically insulated from the memory chips 42 disposed thereunder. When the thermoelectric cooling package 5 is connected to a casing 120, the first TEC 10a may be connected to the casing 120. The first TEC 10a may be electrically connected to the second package substrate 40 to be applied with voltages. If a positive voltage is applied to a P-type semiconductor 12pa of the first TEC 10a and a negative voltage is applied to an N-type semiconductor 12na of the first TEC 10a, the first TEC 10a may absorb heat from the memory chips 42 to transfer the heat to the casing 120. The thermoelectric cooling package 5 may further include a second TEC 10b embedded in the first package substrate 20. The second TEC 10b may be applied with voltages through the first package substrate 20. If a negative voltage is applied to a P-type semiconductor 12pb of the second TEC 10b and a positive voltage is applied to an N-type semiconductor 12nb of the second TEC 10b, the second TEC 10b may absorb heat from the logic chip 32 to discharge the heat through the board 90.

[Examples of Electronic Systems]

Figure 8A:
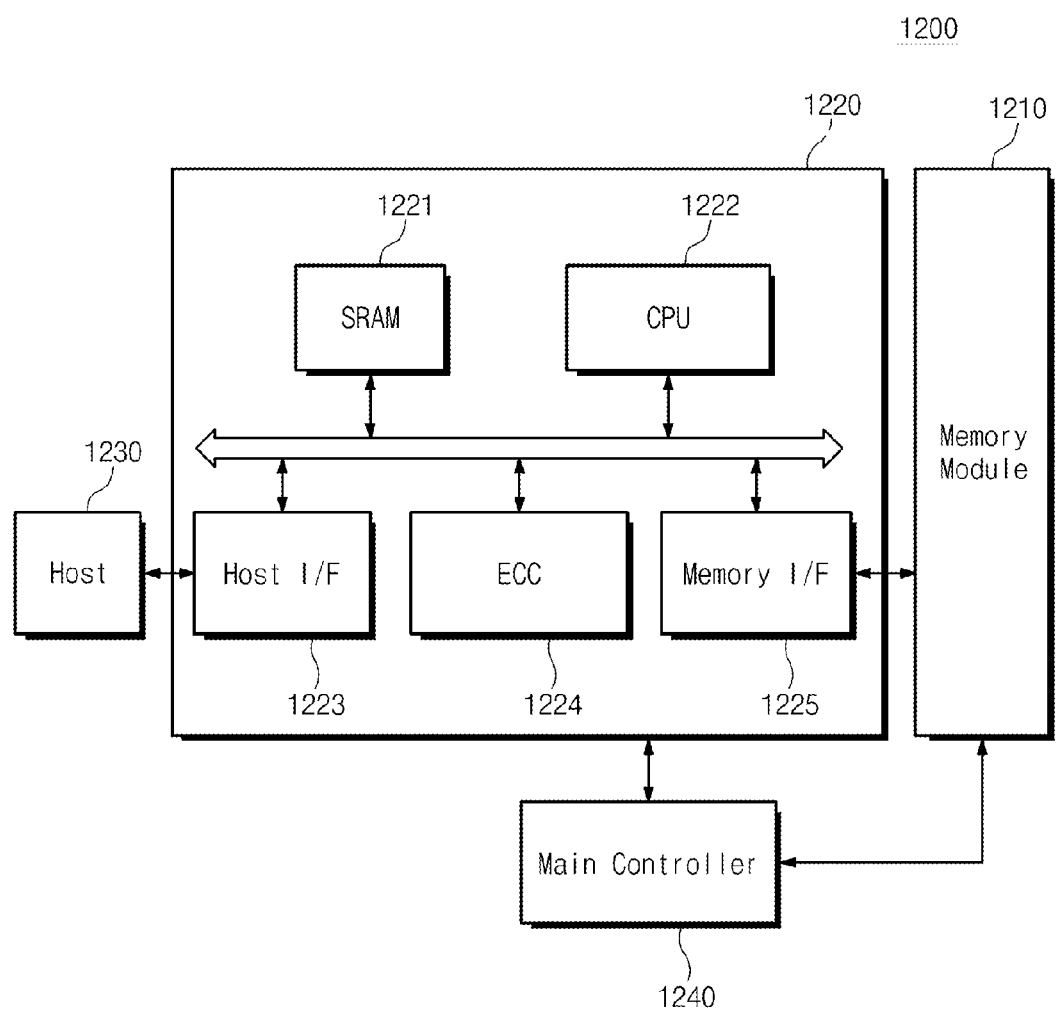
FIG. 8A is a schematic block diagram illustrating an example of memory cards including a thermoelectric cooling package according to exemplary embodiments of the inventive concept.
Figure 8B:
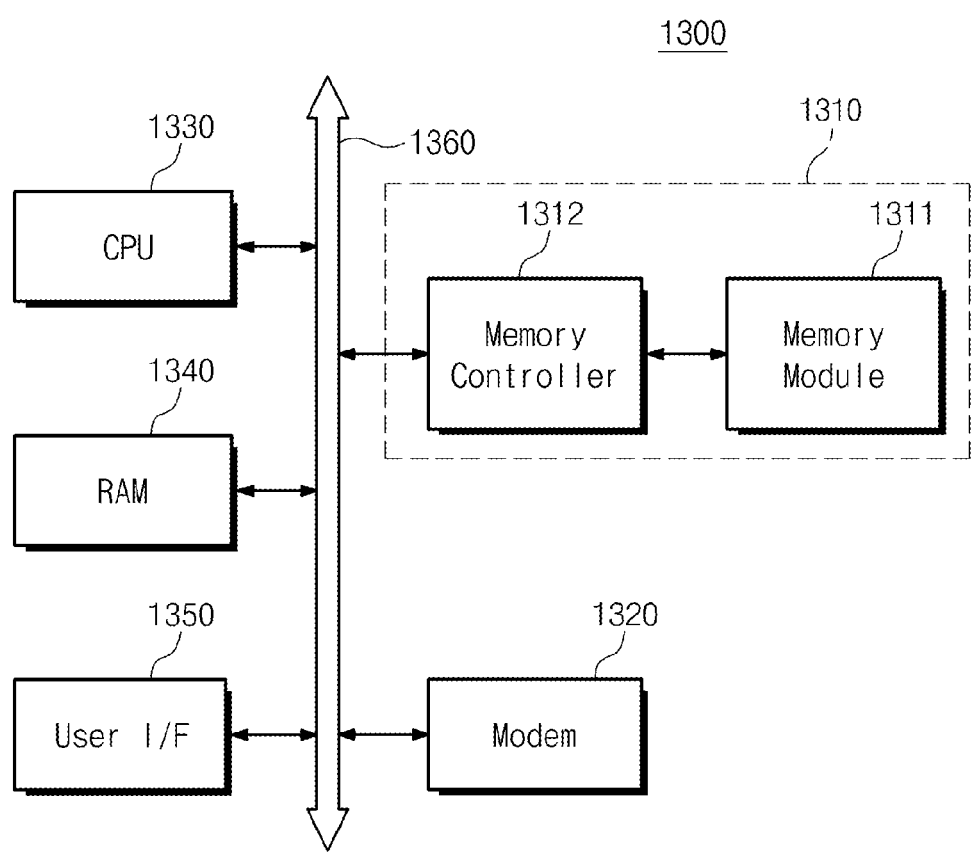
FIG. 8B is a schematic block diagram illustrating an example of information processing systems including a thermoelectric cooling package according to exemplary embodiments of the inventive concept.

FIG. 8A is a schematic block diagram illustrating an example of memory cards including a thermoelectric cooling package according to exemplary embodiments of the inventive concept. FIG. 8B is a schematic block diagram illustrating an example of information processing systems including a thermoelectric cooling package according to exemplary embodiments of the inventive concept.

Referring to FIG. 8A, a semiconductor memory module 1210 including at least one of the semiconductor packages 1 to 5 according to the exemplary embodiments described above may be applied to a memory card 1200. In an embodiment, the memory card 1200 may include a memory controller 1220 that controls data communication between a host 1230 and the semiconductor memory module 1210. A SRAM device 1221 may be used as an operation memory of a central processing unit (CPU) 1222. A host interface unit 1223 may be configured to include a data communication protocol of the host 1230 connected to the memory card 1200. An error check and correction (ECC) block 1224 may detect and correct errors of data which are read out from the semiconductor memory module 1210. A memory interface unit 1225 may be interfaced with the semiconductor memory module 1210. The central processing unit (CPU) 1222 may control overall operations of the memory controller 1220. The at least one of the semiconductor packages 1 to 5 according to the exemplary embodiments may be included in the SRAM device 1221, the ECC block 1224 and/or the CPU 1222. A main controller 1240 may control the operations described above. The main controller 1240 may comprise the at least one of the semiconductor packages 1 to 5 according to the exemplary embodiments. Alternatively, the main controller 1240 may control the SRAM device 1221, the ECC block 1224 and/or the CPU 1222 using the DTM methods as depicted in FIGS. 5C to 5O.

Referring to FIG. 8B, an information processing system 1300 may include a memory system 1310 having at least one of the semiconductor packages 1 to 5 according to the above embodiments of the inventive concept. The information processing system 1300 may include a mobile system, a computer or the like. In an embodiment, the information processing system 1300 may include the memory system 1310, a modulator-demodulator (MODEM) 1320, a central processing unit (CPU) 1330, a random access memory (RAM) device 1340 and a user interface unit 1350 that communicate with each other through a data bus 1360. The memory system 1310 may include a memory module 1311 and a memory controller 1312. The memory system 1310 may have substantially the same configuration as the memory card 1200 of FIG. 8A. The memory system 1310 may store data processed by the CPU 1330 or data transmitted from an external system. The information processing system 1300 may be applied to a memory card, a solid state disk, a camera image sensor or an application chipset. In some embodiments, the memory system 1310 may be realized as a solid state drive (SSD). In this case, the information processing system 1300 may stably and reliably store massive data into the memory system 1310.

According to the inventive concept, since the thermoelectric cooler is used, the semiconductor chip or the semiconductor package may be fast cooled. Additionally, since the change of the clock speed of the semiconductor chip may not be required, the semiconductor chip may maintain the high performance thereof.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A device comprising:
   a first board comprising a first area and a second area not overlapping the first area;
   a thermoelectric semiconductor disposed at the first area of the first board configured to supply a voltage to the thermoelectric semiconductor;
   a package disposed at the second area of the first board; and
   a second board,
   wherein the thermoelectric semiconductor is disposed between the first board and the second board,
   a heat gradient is generated in the thermoelectric semiconductor when the voltage is supplied to the thermoelectric semiconductor, and
   the first area and the second area are separated by a gap formed in the first board.

2. The device of claim 1, further comprising a heat sink disposed adjacent to the second board.

3. The device of claim 1 further comprising a controller which controls a supply of the voltage to the thermoelectric semiconductor so that the voltage is supplied if a temperature of the package is above a target temperature and the voltage is not supplied if the temperature is below the target temperature.

4. The device of claim 1 further comprising a temperature sensor which detects a temperature of the package and a voltage is supplied to the thermoelectric semiconductor based on the detected temperature.

5. A handheld mobile apparatus comprising the device of claim 1 and further comprising:
   a display panel,
   wherein the display panel is disposed adjacent to the device.

6. The handheld mobile device of claim 5 further comprising:
   a lower casing disposed below the device,
   wherein the display panel is displayed above the device, and
   wherein the thermoelectric semiconductor operates to transfer heat from the display panel and heat from the package to the lower casing.

7. The handheld mobile device of claim 5, further comprising temperature sensor disposed inside or on the display panel.

8. The handheld mobile device of claim 5, wherein the display panel is one from among a liquid crystal display panel and an organic light-emitting diode (OLED) display.

9. The handheld mobile device of claim 8, wherein the OLED display is an active-matrix OLED display.

10. The handheld mobile device of claim 5, wherein the thermoelectric semiconductor is repetitively turned on and off.

11. The device of claim 1, wherein the first board comprises vias which are formed in the first board through the first area and supply the voltage to the thermoelectric semiconductor.

12. The device of claim 1, wherein the thermoelectric semiconductor comprises at least two elements, and the device further comprises:
    a controller configured to control a supply of the voltage to the thermoelectric semiconductor and control a change in a heat transfer direction in the thermoelectric semiconductor in response to changing a polarity of the voltage supplied to each of the at least two elements.

13. A device comprising:
    a first board comprising a first area and a second area not overlapping the first area;
    a thermoelectric semiconductor disposed at the first area of the first board configured to supply a voltage to the thermoelectric semiconductor;
    a package disposed at the second area of the first board; and
    a second board,
    wherein the thermoelectric semiconductor is disposed between the first board and the second board,
    a heat gradient is generated in the thermoelectric semiconductor when the voltage is supplied to the thermoelectric semiconductor,
    the heat is transferred substantially along an open loop path from a first portion of a lower half of the device including the package, to an upper half of the device, and from the upper half of the device to a second portion of the lower half of the device that is not overlapping with the first portion,
    the lower half of the device is disposed proximate the first board, and
    the upper half of the device is disposed proximate the second board.

* * * * *